US006385751B1

United States Patent
Wolf

(10) Patent No.: US 6,385,751 B1
(45) Date of Patent: May 7, 2002

(54) PROGRAMMABLE, RECONFIGURABLE DSP IMPLEMENTATION OF A REED-SOLOMON ENCODER/DECODER

(75) Inventor: Tod D. Wolf, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/464,061

(22) Filed: Dec. 15, 1999

Related U.S. Application Data

(60) Provisional application No. 60/114,186, filed on Dec. 30, 1998.

(51) Int. Cl.[7] .............................................. H03M 13/15
(52) U.S. Cl. ...................................................... 714/784
(58) Field of Search ........................................ 714/784

(56) References Cited

U.S. PATENT DOCUMENTS 4,649,541 A * 3/1987 Lahmeyer .................... 714/784
5,323,402 A 6/1994 Vaccaro et al. ............. 371/37.1

FOREIGN PATENT DOCUMENTS

WO     WO 99/45911     9/1999

OTHER PUBLICATIONS

Murakami Atsumichi, "Coding and Decoding Circuit of Error Correction Code" Patent Abstract of Japan, Publ. No. 612375521, Publ. Date Oct. 22, 1986.
Bruce L. Johnson , "Design and Hardware Implementation of a Versatile Transform Decoder for Reed–Solomon Codes" The Mitre Corporation, pp. 447–464.
M. Hahn, "Channel Codec Performs Versatile Error–Correction" IEE Proceedings, vol. 137, Pt. E, No. 3, pp. 197–201, May 1990.

* cited by examiner

*Primary Examiner*—Stephen M. Baker
(74) *Attorney, Agent, or Firm*—Robert D. Marshall, Jr.; W. James Brady, III; Frederick J. Telecky, Jr.

(57) ABSTRACT

A programmable, reconfigurable Reed-Solomon encoder/decoder allows for flexible reprogramming of encoders and decoders for a variety of applications. The standard Reed-Solomon parameters of the Galois Field order, the primitive polynomial, the number of symbols for each codeword of the transmitted and source data are settable via writable registers. The Reed-Solomon encoder/decoder may be coupled to a digital signal processor which specifies the parameters loaded in the writable registers via data register space of data memory space. The decoder and encoder parameters are separately specified and the decoder and encoder can run simultaneously and independently.

23 Claims, 9 Drawing Sheets

REED-SOLOMON MEORY MAP

| TYPE OF MEMORY | ADDRESS | DATA SIZE |
|---|---|---|
| ENCODER REGISTERS | 000-07F | 6 |
|     DMA | 000 | 6 |
|     COMMAND1 | 002 | 6 |
|     COMMAND2 | 003 | 6 |
|     STATUS1 | 004 | 6 |
|     STATUS2 | 005 | 6 |
|     SIGNAL1 | 006 | 6 |
|     SIGNAL2 | 007 | 6 |
|     GF | 008 | 6 |
|     PPOLY | 010 | 6 |
|     N | 018 | 6 |
|     K | 020 | 6 |
|     T | 028 | 6 |
|     XTEND | 030 | 6 |
|     J0 | 038 | 6 |
|     SEMULT | 040 | 6 |
|     RESET | 07F | 6 |
| ENCODER DATA RAM0 | 100-17F | 16 |
| ENCODER DATA RAM1 | 180-1FF | 16 |
| ENCODER EXP RAM LOW | 200-27F | 8 |
| ENCODER EXP RAM HIGH | 280-2FF | 8 |
| UNUSED | 300-3FF | |
| DECODER REGISTERS | 400-47F | 6 |
|     DMA | 400 | 6 |
|     COMMAND1 | 402 | 6 |
|     COMMAND2 | 403 | 6 |
|     STATUS1 | 404 | 6 |
|     STATUS2 | 405 | 6 |
|     SIGNAL1 | 406 | 6 |
|     SIGNAL2 | 407 | 6 |
|     GF | 408 | 6 |
|     PPOLY | 410 | 6 |
|     N | 418 | 6 |
|     K | 420 | 6 |
|     T | 428 | 6 |
|     XTEND | 430 | 6 |
|     J0 | 438 | 6 |
|     SEMULT | 440 | 6 |
| DECODER DATA RAM0 | 500-57F | 16 |
| DECODER DATA RAM1 | 580-5FF | 16 |
| DECODER EXP RAM LOW | 600-67F | 8 |
| DECODER EXP RAM HIGH | 680-6FF | 8 |
| DECODER RECIP RAM LOW | 700-77F | 8 |
| DECODER RECIP RAM HIGH | 780-7FF | 8 |

FIG. 11

PROGRAMMABLE, RECONFIGURABLE DSP IMPLEMENTATION OF A REED-SOLOMON ENCODER/DECODER

This application claims priority under 35 USC §119(e)(1) of Provisional Application No. 60/114,186, filed Dec. 30, 1998.

TECHNICAL FIELD OF THE INVENTION

The technical field of this invention is electronic circuits for communications error correction.

BACKGROUND OF THE INVENTION

Digital communication systems have developed to a high degree of sophistication in the past two or three decades. Features that, not long ago, could be built into these systems only at enormous expense, can now be deployed in a wide range of applications including consumer electronics. Specifically, error detection and correction (EDAC) techniques, which have long been understood mathematically, were often not practical because of hardware costs. Only simple Hamming Code EDAC's with single bit correction were practical in low-cost applications. A Reed-Solomon EDAC, on the other hand, uses a powerful encoder/decoder technique that has excellent capability to correct multiple bit errors resulting from high-noise interference environments such as critical space communication, yet are producible at reasonable cost allowing for widespread usage even in moderate-cost products.

Recent advances in electronics have now made high-speed digital data communications prevalent in many types of applications and uses. Digital communication techniques are now used for communication of audio signals for telephony, with video telephony now becoming available in some locations. Digital communication among computers is also prevalent, particularly with the advent of the Internet. Computer-to-computer networking by way of dedicated connections (e.g., local-area networks) and also by way of dial-up connections has also become prevalent in recent years.

The quality of communications carried out in these ways depends upon the accuracy with which the received signals match the transmitted signals. Some types of communications, such as audio communications, can withstand bit loss to a relatively large degree. However, the communication of digital data, especially of executable programs, requires exact fidelity in order to be at all useful. Accordingly, various techniques for the detection and correction of errors in communicated digital bit streams have been developed. Indeed, error correction techniques have effectively enabled digital communications to be carried out over available communication facilities, such as existing telephone lines, despite the error rates inherent in high-frequency communication over these facilities.

Error correction may also be used in applications other than the communication of data and other signals over networks. For example, the retrieval of stored data by a computer from its own magnetic storage devices also typically utilizes error correction techniques to ensure exact fidelity of the retrieved data; such fidelity is essential in the reliable operation of the computer system from executable program code stored in its mass storage devices. Digital entertainment equipment, such as compact disc players, digital audio tape recorders and players, and the like also now typically utilize error correction techniques to provide high fidelity output.

An important class of error detection and error correction techniques is referred to as Reed-Solomon coding, and was originally described: by the Reed-Solomon article entitled: "Polynomial Codes over Certain Finite Fields" (see reference 1) Reed-Solomon coding uses Galois Field arithmetic, to map blocks of a communication into larger blocks. In effect, each coded block corresponds to an over-specified polynomial based upon the input block.

Reed-Solomon code based EDACs are used now in many communication systems such as satellites, modems, audio compact discs, and wireless phones. Each one of these systems is defined by a standard. The standard will define the parameters for the Reed-Solomon encoder/decoder. The encoder/decoder. implies an encoder plus a companion decoder. Table 1 below lists a few of those Reed-Solomon parameters for several communication standards. Each communication standard has different values for the parameters which define an Reed-Solomon code.

TABLE 1

| Standard | Galois Field | n | k | t | p(x) |
| --- | --- | --- | --- | --- | --- |
| IEEE 802.14-A | 256 | 204 | 188 | 8 | p1 (x) |
| IEEE 802.14-B | 128 | 128 | 122 | 3 | p2 (x) |
| CAP | 256 | 5 to 255 | 1 to 251 | 2 | p1 (x) |
| DMT | 256 | 3 to 255 | 1 to 253 | 1 to 8 | p1 (x) |
| W-CDMA | 256 | 36 | 32 | 2 | p3 (x) |

The parameters "Galois Field", "n", "k", "t", and "p(x)" will now be described.

Reed-Solomon encoders/decoders use Finite Field arithmetic which is sometimes called Galois Field arithmetic and includes addition, multiplication, division, and exponentiation, in many data processing steps. The rules for such arithmetic operations are completely different from normal binary arithmetic. The primitive polynomial p(x) is used to define the result. The designation GF(X) refers to the number of possible bit combinations of a symbol in a given standard. Thus GF(256) refers to an eight-bit symbol and GF(8) refers to a 3-bit symbol.

Reed-Solomon codes are block codes, meaning that a message at the source is divided into "k" blocks of symbols having a designated number of bits "m". For a given system as defined by one of the standards in the table above, for example, two other parameters are used: "n" is the number of symbols in a channel codeword, and "t" is the number of symbol blocks which can be corrected per each message of k blocks. Thus a particular Reed-Solomon code choice would be represented by: RS(n,k,t). The source codeword, k blocks of symbols, is designated by i(x), and the channel codeword of n blocks of symbols is designated by c(x). The (n–k) excess symbols, called parity symbols, are added to the source word to constitute the codeword, and the number of symbol errors which this system can correct is t=(n–k)/2.

Reed-Solomon encoder/decoders provide forward error correction (FEC) by adding redundancy to the source information. Forward error correction refers to the concept that the receiver does not have an opportunity to communicate with the source. One example of this is the transmitter on a distant planet which cannot interactively communicate with the receiver on earth and make adjustments based on received data (for example, retransmit a new copy of the data which was received and found to be corrupted). The data is transmitted through a non-perfect channel which could introduce errors and is received at the receiver. The Reed-Solomon decoder decodes and corrects the data.

An overall Reed-Solomon encoder/decoder system is shown in FIG. 1. A Reed-Solomon encoder receives and encodes source codeword i(x) including n symbols. The channel codeword c(x) is transmitted by a non-perfect communications channel. The non-perfect channel introduces errors, designated in FIG. 1 by e(x). The received codeword r(x) has the potential of symbols corruption. Thus the received codeword r(x) may not equal the channel codeword c(x). The Reed-Solomon decoder does the reverse operation of the Reed-Solomon encoder plus an EDAC function. If there were no errors, the decoded codeword i'(x) would be restored to the same codeword as the source codeword i(x) without need for error correction. Thus:

$$i'(x)=i(x).$$

Additionally, if there are symbol errors less than or equal to t in received codeword r(x), then the decoded keyword i'(x) would be also be restored to the same codeword as the source codeword i(x) after error correction. Thus:

$$i'(x)=i(x).$$

The Reed-Solomon encoder uses the generator polynomial γ(x) in the following equation to generate the channel codeword c(x). The equation of the channel codeword is in systematic form.

$$C(x) = x^{n-k}u(x) + REM\left[\frac{x^{n-k}u(x)}{\gamma(x)}\right]$$

γ(x) is defined as:

$$\gamma(x) = \prod_{i=0}^{2t-1}(x - a^{i+j_0})$$

$j_0$ is an integer and is used to vary the result of γ(x)
The error polynomial is labeled as e(x) and:

$$r(x)=c(x)+e(x)$$

The purpose of the Reed-Solomon decoder is to solve for e(x) and calculate i'(x). If the number of errors added to the block is less than or equal to t, then i (x)=i'(x).

Reed-Solomon encoders/decoders have been built using chip sets consisting of ASIC (Application Specific Integrated circuit) processor elements, DSP (Digital Signal Processor) chips, SRAM (Static Random Access Memory), DRAM (Dynamic Random Access Memory), EPROM (Electrically Programmable Read Only Memory) and other special circuit elements. These types of systems are in wide use in many differentiated products. However design of each variation of these systems calls for extraordinary effort and expense (new ASIC chips, for example) even if they have many similarities to the products being superseded.

FIGS. 2 and 3 illustrate the common features of conventional Reed-Solomon encoder/decoder devices. FIG. 2 illustrates one prior art example of an architecture for a conventional Reed-Solomon encoder. In FIG. 2 each symbol is one eight bit byte in size (i.e., m=8). The example of FIG. 2 uses Galois field arithmetic where the size of the Galois field is $2^8$. In FIG. 2 the maximum codeword length is $2^8-1$, or 255 symbols. Other architectures may be used to, derive the encoded codeword for the same message and check symbol coefficients $C_z$, or for other symbol sizes or other maximum codeword lengths. In the example of FIG. 2, sixteen check symbols are generated for each codeword, thus eight errors per codeword may be corrected. According to conventional Reed-Solomon encoding, the k message bytes in the codeword ($M_{k-1}$, $M_{k-2}$, . . . , $M_0$) are used to generate the check symbols ($C_{15}$, $C_{14}$, . . . , $C_0$). These check symbols $C_z$ are the coefficients of a polynomial C(x)

$$C(x)=C_{15}x^{15}+C_{14}x^{14}+ \ldots +C_0$$

which is the remainder of the division of a message polynomial M(x) having the message bytes as coefficients:

$$M(x)=M_{k-1}x^{k-1}+M_{k-2}x^{k-2}+ \ldots +M_0$$

by a divisor referred to as generator polynomial G(x):

$$G(x)=(x-a^0)(x-a^1)(x-a^2) \ldots (x-a^{15})$$

where each value $a^i$ is a root of the binary primitive polynomial $x^8+x^4+x^3+x^2+1$. The exemplary architecture of FIG. 2 includes sixteen eight-bit shift register latches 220 through 235, which will contain the remainder values from the polynomial division, and thus will produce the check symbol coefficients $C_{15}$ through $C_0$, respectively. An eight-bit exclusive-OR function 241 through 255 is provided between each pair of shift register latches 220 through 235 to effect Galois field addition, with XOR function 255 located between latches 235 and 234, and so on. The feedback path produced by exclusive-OR function 267, which receives both the input symbol 269 and the output of the last latch 235, presents the quotient for each division step. This quotient is broadcast to sixteen constant Galois field multipliers 265 through 260, which multiply the quotient by respective ones of the coefficients $G_{15}$ through $G_0$. In operation, the first "k" symbols contain the message itself, and are output directly as the leading portion of the codeword. Each of these message symbols, $M_z$, enters. the encoder architecture of FIG. 2 on IN lines 269, and is applied to the division operation carried out by this encoder. Upon completion of the operations of the architecture of FIG. 2 upon these message bytes, the remainder values retained in shift register latches 235 through 220 correspond to the check symbols $C_{15}$ through $C_0$, and are appended to the encoded codeword after the "k" message symbols.

The encoded codewords are then communicated in a digital bitstream, and communicated in the desired manner, after the appropriate formatting. For communications over telephone facilities the codewords may be communicated either digitally or converted to analog signals; digital network or intra-computer communications will maintain the codewords in their digital format. Regardless of the communications medium, errors may occur in the communicated signals. These errors will be reflected in the received bitstream as opposite binary states from those in the input bitstream prior to the encoding process of FIG. 2. The decoding process seeks to correct these errors. This decoding process will now be described in a general manner relative to FIG. 3.

Decoder 300 of FIG. 3 receives an input bitstream of codeword symbols. A single codeword consists of received codeword r(x) in FIG. 1. Received codeword r(x) is applied to syndrome accumulator 312, which generates a syndrome polynomial s(x) 302 of the form:

$$s(x)=s_{J-1}x^{J-1}+s_{J-2}x^{J-2}+ \ldots s_1x+s_0$$

Syndrome polynomial s(x) 302 indicates whether errors were introduced into the communicated signals over the communication facility. If s(x)=0, no errors were present. If s(x) is non-zero, one or more errors are present in the codeword under analysis. Syndrome polynomial s(x), in the form of a sequence of coefficients, is then forwarded to Euclidean array block 315.

Euclidean array block 315 generates two polynomials $\Lambda(x)$ 303 and $\Omega(x)$ 304 based upon the syndrome polynomial s(x) 302 received from syndrome accumulator 312. The degree v of polynomial $\Lambda(x)$ 303 indicates the number of errors in the codeword. Polynomial $\Lambda(x)$ 303 is forwarded to Chien Search block 316 for additional analysis. Polynomial $\Omega(x)$ 304 is also generated by Euclidean array block 315, and is forwarded to Forney block 318. Forney block 318 uses polynomial $\Omega(x)$ 304 to evaluate the error in the received bitstream r(x) 301.

Polynomials $\Lambda(x)$ 303 is generally referred to as the error locator polynomial. Chien Search block 316 utilizes polynomial $\Lambda(x)$ 303 to generate the zeros polynomial $\chi(x)$ 305 from which Forney block 318 determines the error magnitude polynomial M(x) 306. Chien Search block 316 also generates polynomial P(x) 307, which indicates the position of the errors in the received codeword r(x) 301. Error Addition block 319 then uses the magnitude of the errors as indicated by polynomial M(x) 306, and the position of these errors as indicated by polynomial P(x) 307 to generate the corrected bitstream i'(x) 308.

SUMMARY OF THE INVENTION

This invention relates to programmable, reconfigurable implementations of Reed-Solomon encoder/decoder devices that could be cast into one of three separate designs.

The first design is a stand-alone Reed-Solomon encoder/decoder as illustrated in FIG. 4. This first design includes built-in programmability and reconfigurability through the use of a specially designed Reed-Solomon control block. This Reed-Solomon control block has its own state machine, a bank of special addressable registers, and control logic which allows the user to program and reconfigure the device for a wide variety of applications. The major signals of the stand alone Reed-Solomon encoder/decoder are shown in FIG. 4 and this figure along with FIG. 7 will be used in the text to follow to describe the unique characteristics of this implementation which is the preferred embodiment of this invention.

This first design is supplied with built-in programmability and reconfigurability through the use of the specially designed Reed-Solomon control block. This Reed-Solomon control block has its own state machine, a bank of special addressable registers, a data distribution network, and control logic which allows the user to program and reconfigure the device for a wide variety of applications.

FIG. 5 illustrates the second design of a Reed-Solomon encoder/decoder coprocessor that is to be used with a host DSP or CPU device. This design also allows the user to interface with the host DSP or CPU and program and reconfigure the device for a wide variety of applications. FIG. 5 shows a generic DSP, such as a Texas Instruments TMS320C54. This digital signal processor includes plural execution units. Exponent unit 132 handles exponent manipulation for floating point computations. Multiply/add unit 134 includes a single cycle integer multiplier which may be used in multiply and accumulate operations using accumulators A and B 140. Arithmetic logic unit 136 performs addition, subtraction and logical/compare operations. Barrel shifter 138 performs various shift and rotate operations. Compare select and store unit 142 controls evaluation of conditions for conditional operations and storing results. Execution units 132, 143, 136, 138, 140 and 142 are coupled to memory/peripheral interface 145 via P, C, D and E busses. Memory/peripheral interface controls data exchange with memory and peripherals. Program control and address generator 149 interfaces with an instruction memory space calculating the next instruction address and decoding program instructions for execution via the execution units 132, 143, 136, 138, 140 and 142. Data registers and address generator 148 includes the architected data registers as well as the data address generator. This data address generator calculates the address within a data address space for data reads from and data writes to a data memory. The example illustrated in FIG. 5 includes a random access memory 144 consisting of 6K 16-bit data words and a read only memory 146 consisting of 48K 16-bit instruction words. Those skilled in the art would realize that this illustrated amount of memory represents merely one design example and that more or less memory could be provided as part of the digital signal processor. The digital signal processor includes various system wide services. Phase locked loop clock generator 150 receives an external CLK signal and generates clock control for various parts of the digital signal processor that may include plural clock signals of differing frequencies. Timer 151 is a programmable count-down time used for timing real time events. JTAG test port 152 permits testing of digital signal processor via a serial. scan path in a manner known in the art. Serial and host ports 153 provide connection to various devices external to the digital signal processor. Power distribution 156 provides electric power to the various parts of the digital signal processor. Interface unit 158 provides handshaking to an external memory bus as well as connection to DSP/RS coder interface 160, which controls transmission of data and control signals between the digital signal processor and the Reed-Solomon encoder/decoder.

FIG. 6 illustrates the third design of a custom Reed-Solomon encoder/decoder integrated circuit with an embedded digital signal processor device or CPU device. This design also includes built-in programmability and reconfigurability through the use of the specially designed Reed-Solomon control block. This Reed-Solomon control block has its own state machine, a bank of special addressable registers, a data distribution network, and control logic. This design allows for efficient use in applications implementing not only Reed-Solomon encode/decode but additional processes, which would conventionally make use of a host DSP or CPU and other companion coprocessors. An example would be applications where a convolutional decoder is employed, using Viterbi decoding, convolutional decoding, and other processes. FIG. 6 shows a generic digital signal processor, such as a Texas Instruments TMS320C54, in the same form as illustrated in FIG. 5. The embedded DSP interfaces to the Reed-Solomon encoder/decoder via the "P", "C", and "D" busses internal to the DSP. Connection and interaction between the digital signal processor and the Reed-Solomon coprocessor preferably occurs in accordance with the description of U.S. Provisional Patent Application No. 60/073,668 filed Feb. 4, 1998 and entitled DIGITAL SIGNAL PROCESSOR WITH EFFICIENTLY CONNECTABLE HARDWARE CO-PROCESSOR.

All three implementations of this invention are designed for both encoding and decoding, and implement a wide variety of Reed-Solomon codes with a single hardware solution. All the parameters relating to a given system standard are programmable. The encoder and decoder are independent of one another and can be executed in parallel in one unit if both transmitter and receiver are local, that is, a part of the same piece of equipment. The encoder and decoder could be executing completely different Reed-Solomon codes.

The implementation of this invention, as noted above, could be in the form of either a chip set of multiple chips partitioned for best system cost or a fully integrated chip containing all elements of a Reed-Solomon encoder/decoder system. In the most simple form illustrated in FIG. 4 the device would be programmed in its own application board where the reset and setup operations would be carried out. In the second and third designs illustrated in FIGS. 5 and 6, respectively, software would be developed which would be a derivative of that developed for a standard host processor, such as the DSP illustrated in FIGS. 5 and 6, of similar architecture. This software would have all the other code to allow the use of the chip set or single chip of this invention to fully program and fully reconfigure all of the Reed-Solomon encoder/decoder hardware for an extremely wide variety of Reed-Solomon encoder/decoder system applications.

The programming and reconfiguring of the Reed-Solomon encoder/decoder of this invention is straightforward and is reduced to a sequence of operations directed to loading addressable registers with all the necessary information to carry out the encoder or decoder operation completely.

BRIEF DESCRIPTION OF THE DRAWINGS

These and other aspects of this invention are illustrated in the drawings, in which:

FIG. 11 illustrated an address map for the Reed-Solomon encoder/decoder command registers and RAMS;

DETAILED DESCRIPTION OF PREFERRED EMBODIMENTS

Figure 4:
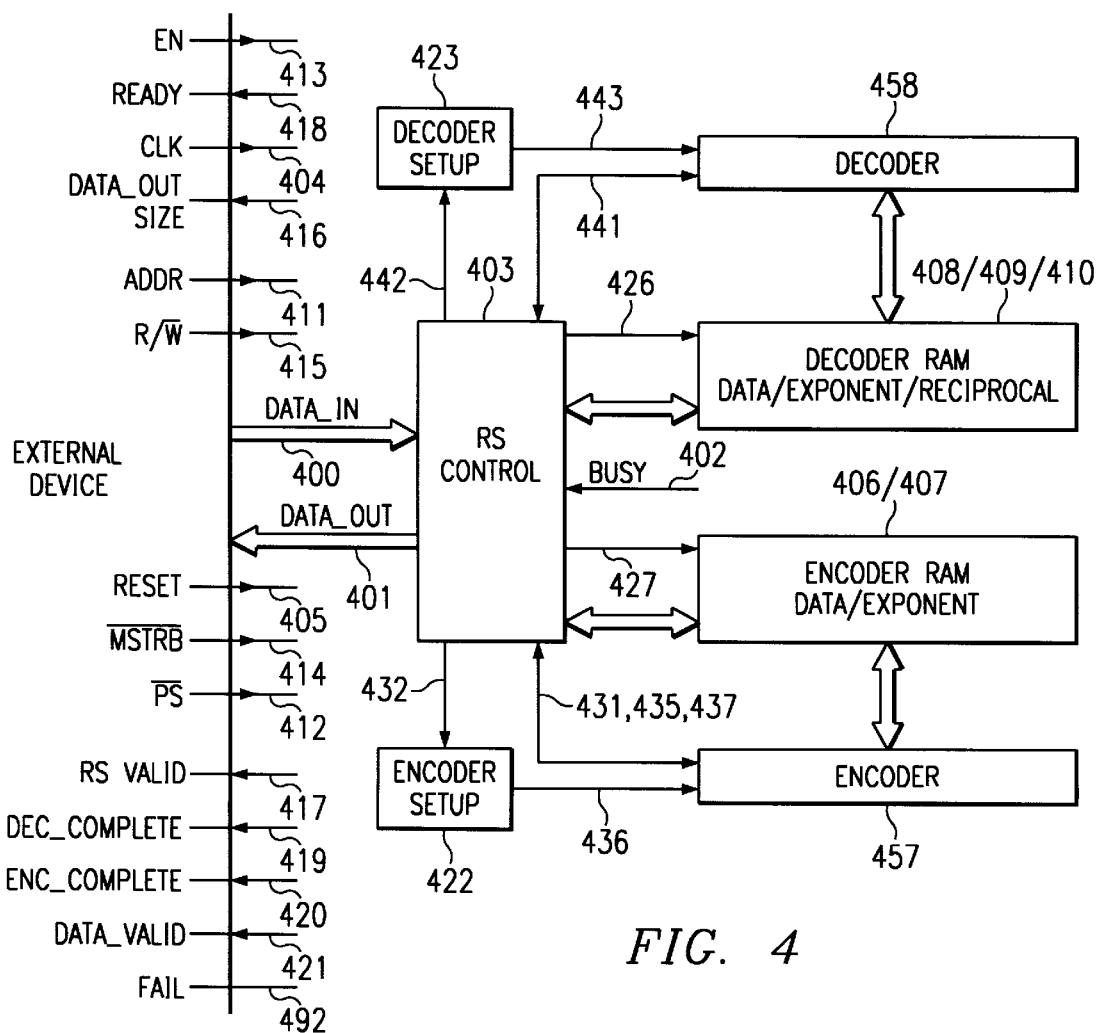
FIG. 4 is a stand-alone Reed-Solomon encoder/decoder according to a first embodiment of this invention.

The Reed-Solomon encoder/decoder of the preferred embodiment of this invention is a stand alone Reed-Solomon encoder/decoder illustrated in FIG. 4. The basic operation of the system is as follows. Blocks of data are transferred from an external source to the Reed-Solomon encoder/decoder by the data bus. The data bus is shown as two physical buses 400 and 401 but could. also be a single bidirectional bus. Data bus 400 is for data input and data bus 401 is for data output. The Reed-Solomon control block 403 issues commands which are forwarded to the various functional blocks of the Reed-Solomon encoder/decoder. These commands will be described in later sections. During encoding and decoding, the busy signal 402 will be active.

Figure 12:
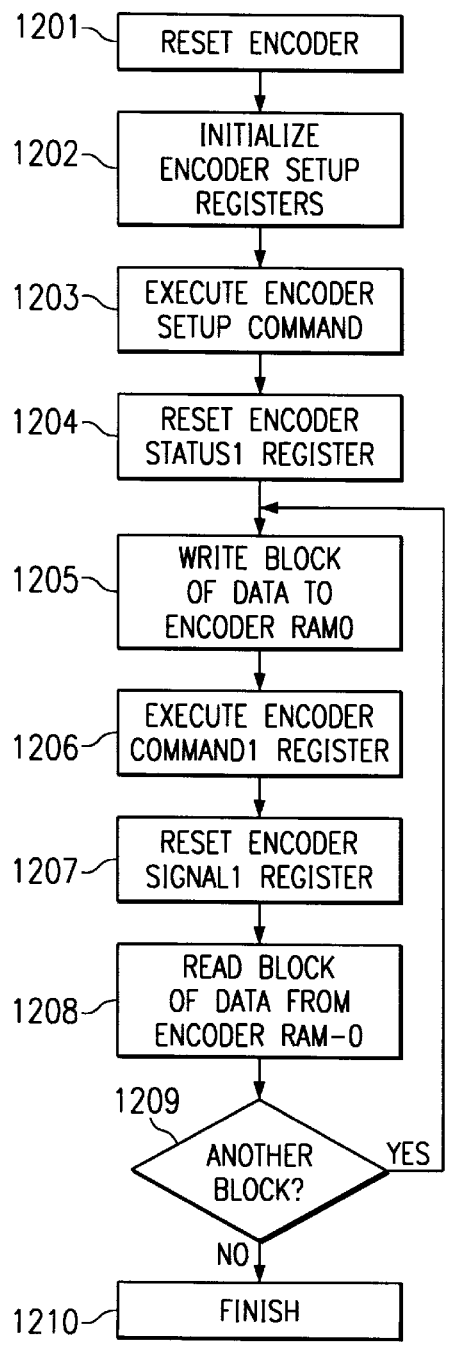
FIG. 12 is a programming flow chart for Reed-Solomon decoder using addressable registers of this invention.

Programmability and reconfigurability for the Reed-Solomon encoder/decoder is accomplished by the following sequence of process steps. The addressable registers within Reed-Solomon control block 403 and all of the device functions which emanate from the Reed-Solomon control block 403 for both encoding and decoding are the core concepts of this invention. This encoding sequence will be described more fully later in the text and in flow chart form with reference to FIG. 12. The reference block numbers for the flow chart of FIG. 12 are noted here.

ENCODING (1) Reset the encoder using the RESET command register (block 1201).

(2) Initialize the encoder using the Reed-Solomon encoder setup registers (block 1202).

(3) Execute the encoder setup command using the COMMAND1 register with the status completion register enabled (block 1203).

(4) Reset the STATUS1 register (block 1204).

(5) Write a block of data to the encoder data RAM0 using DMA with the COMMAND2 register (block 1205).

(6) Execute the Reed-Solomon encoder using the COMMAND1 register and enable the status completion signal (block 1206).

(7) Reset the SIGNAL1 register and the ENC_COMPLETE signal goes "high" (block 1207).

(8) Read a block of data from the encoder data RAM0 using DMA with the COMMAND1 register (block 1208).

(9) If more blocks are to be encoded (block 1209), then repeat steps 5 through 8. If not, the encoding process is finished (block 1210).

Figure 13:
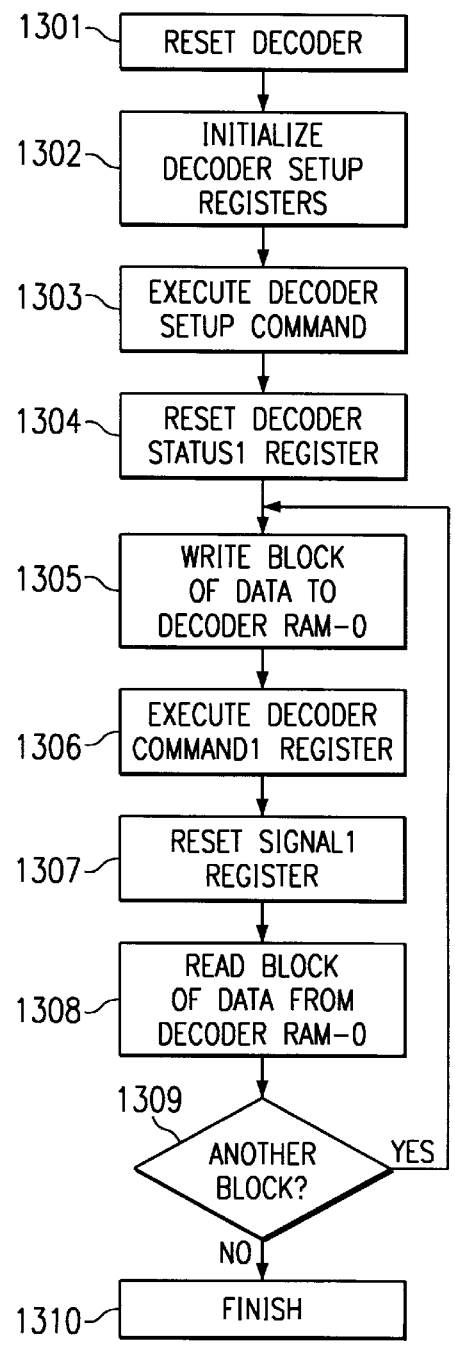
FIG. 13 is a programming flow chart for Reed-Solomon encoder using addressable registers of this invention.

Similarly, using the addressable registers within Reed-Solomon Control, the basic sequence of steps for decoding is described as follows. This decoding sequence will be described more fully later in the text and in flow chart form with reference FIG. 13. The reference block numbers for the flow chart of FIG. 13 are noted here.

DECODING (1) Reset the decoder using the RESET command register (block 1301).

(2) Initialize the decoder using the Reed-Solomon decoder setup registers (block 1302).

(3) Execute the decoder setup command using the COMMAND1 register with the status completion register enabled (block 1303).

(4) Reset the STATUS1 register (block 1304).

(5) Write a block of data to the decoder data RAM0 using DMA with the COMMAND2 register (block 1305).

(6) Execute the Reed-Solomon decoder using the COMMAND1 register and enable the status completion signal (block 1306).

(7) Reset the SIGNAL1 register and the DEC_COMPLETE signal goes "high" (block 1307).

(8) Read a block of data from the decoder data RAM0 using DMA with the COMMAND1 register (block 1308).

(9) If more blocks are to be decoded (block 1309), then repeat steps 5 through 8. If not, the decoding process is finished (block 1310).

Below is a description of the Reed-Solomon encoder/decoder input signals with reference to FIG. 4.

CLK—The clock 404 frequency is 100 MHZ or above. All input and output signals are synchronous to the CLK signal. The logic levels applied to any of the input signals are clocked on the rising edge of CLK.

RESET—The reset signal 405 controls the synchronous reset of the device. All internal registers are reset when RESET is low for a clock cycle. The encoder data RAM 406, encoder exponent RAM 407, decoder data RAM 408, decoder exponent RAM 409, and decoder reciprocal RAM 410, are not affected by the RESET signal.

ADDR—The ADDR signal 411 is the address bus for the Reed-Solomon encoder/decoder. For an eleven-bit bus, the 2 Kbyte address space of the Reed-Solomon encoder/decoder is mapped into sixteen blocks each holding 128 addresses. A memory map is illustrated in FIG. 11.

DATA_IN—The DATA_IN signal 400 is the input data bus. Sixteen-bit data transfers can be made to the Reed-Solomon encoder/decoder data RAMs and initialization registers. The data transferred will be in blocks of 8-bit symbols. The symbols will be ordered 0, 1, 2, 3, . . . X. The even symbols will be located on DATA_IN(7:0) and the odd symbols will be located on DATA_IN(15:8). Eight-bit data transfers use DATA_IN(7:0). DATA_IN(0) is the least significant bit.

PS—The program space selected signal 412 controls access to the Reed-Solomon encoder/decoder. When PS is "high", the Reed-Solomon encoder/decoder cannot be accessed. However, if an execute command was previously entered, the Reed-Solomon encoder/decoder will continue to execute to the completion of that command.

EN—The enable signal 413 controls access to the Reed-Solomon encoder/decoder. When EN is "low", the Reed-Solomon encoder/decoder can be accessed. However, if an execute command was previously entered, then the Reed-Solomon encoder/decoder will continue to execute to the completion of that command.

MSTRB—The External Memory Access Strobe signal 414 controls access to the Reed-Solomon encoder/decoder. When MSTRB is "low, the Reed-Solomon encoder/decoder can be accessed. When MSTRB is "high", the Reed-Solomon encoder/decoder cannot be accessed. However, if an execute command was previously entered, then the Reed-Solomon encoder/decoder will continue to execute to the completion of that command.

R/W—The read/not write signal 415 is the read/write mode select signal. When R/W is "high", the and the Reed-Solomon encoder/decoder is enabled, the Reed-Solomon encoder/decoder is in read mode and will output the addressed data. When R/W is "low", the and the Reed-Solomon encoder/decoder is enabled, the Reed-Solomon encoder/decoder is in write mode and will write data to the addressed location.

Below is a description of the Reed-Solomon encoder/decoder output signals with reference to FIG. 4.

DATA_OUT—The DATA_OUT bus 401 is the data output bus. Sixteen-bit data transfers can be made from the Reed-Solomon encoder/decoder data RAMs and initialization registers. The data transferred will be in blocks of 8-bit symbols. The symbols will be ordered 0, 1, 2, 3, . . . X. The even symbols will be located on DATA_IN(7:0) and the odd symbols will be located on DATA_IN(15:8). Eight-bit data transfers can be made from the exponent and reciprocal RAMs. Eight-bit data transfers use DATA_OUT(7:0). DATA_OUT(0) is the least significant bit.

DATA_OUT_SIZE—The DATA_OUT_SIZE signal 416 is the size of the DATA_OUT bus 401 used for the DSP interface. if the DATA_OUT bus is 8 bits, DATA_OUT_SIZE is equal to "00". If the DATA_OUT bus is 16 bits, DATA_OUT_SIZE is equal to "01".

RS_VALID—When the RS_VALID signal 417 is "high", the data on the DATA_OUT bus 401 is valid.

READY—The READY signal 418 is an active low signal. The Reed-Solomon encoder/decoder sets this signal low when it is ready to send or receive data.

DEC_COMPLETE—The DEC_COMPLETE signal 419 is an active low signal. The Reed-Solomon encoder/decoder sets this signal low when the commands of the enabled decoder have completed execution of their tasks. This signal can be enabled and disabled by each of the two decoder command registers. Writing a logical "1" to the enabled decoder signal register is required to reset this signal.

ENC_COMPLETE—The ENC_COMPLETE signal 420 is an active low signal. The Reed-Solomon encoder/decoder sets this signal low when the commands of the enabled encoder have completed execution of their tasks. This signal can be enabled and disabled by each of the two encoder command registers. Writing a logical "1" to the enabled encoder signal register is required to reset this signal.

DATA_VALID—When the DATA_VALID signal 421 is low, the data on the DATA_OUT bus is valid and is available to the DSP to be read. When DATA_VALID is high, the data on the DATA_OUT bus is invalid.

FAIL—The FAIL signal 492 goes active to indicate that the decoder has failed to correct the received code.

TOP LEVEL BLOCK

The Reed-Solomon block, which includes both encoder/decoder and setup and control of a stand alone Reed-Solomon encoder/decoder and is the preferred embodiment of this invention, consists of the several blocks shown in FIG. 4. The five types of functional blocks of FIG. 4 are: (a) Reed-Solomon control block 403 (b) the Galois Field encoder setup block 422 and Galois Field decoder setup block 423; (c) the encoder 457; (d) the decoder 458 and (e) RAM blocks 406, 407, 408, 409, 410. Addition al illustrations of the Reed-Solomon decoder 458 will be given in below and in FIG. 7, to further explain how a conventional decoder block interfaces to the RAMs and unique functional blocks of this invention, particularly the Reed-Solomon control block 403 and the Galois Field decoder setup block 423. First, the state machine, the Reed-Solomon control block 403, and the Reed-Solomon encoder/decoder RAMs 406, 407, 408, 409 and 410 will be described.

STATE MACHINE

Figure 8:
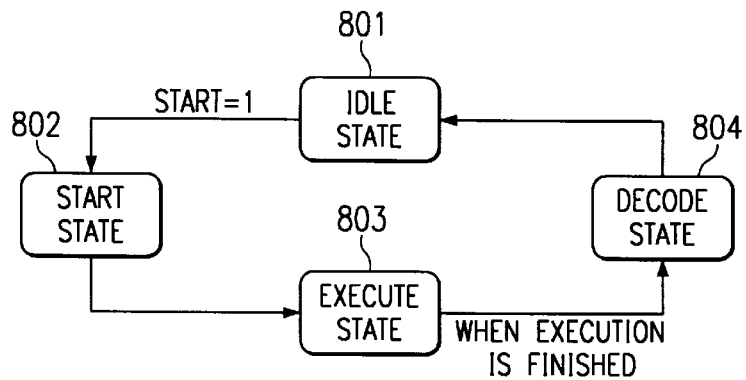
FIG. 8 is a state machine flow diagram for Reed-Solomon control state machine of this invention.

Each of the blocks Reed-Solomon control block 403, Galois Field encoder setup block 422, Galois Field decoder setup block 423, encoder 457 and the decoder 458 illustrated in FIG. 4 include a state machine. The state machine flow is illustrated in FIG. 8. The state machine has four states: Idle 801; Start 802; Execute 803; and Decode 804. Initially the state machine is in Idle state 801. While the block is in the Idle state 801, the block is doing nothing and the busy and decode signals are in an inactive state. When the start signal goes active, the state machine moves into the Start state 802. During the start state, the busy signal goes active. After one clock cycle, the state machine goes to the Execute state 803. During the Execute state, the busy signal remains active. Also, the Reed-Solomon block is executing its function. For example, the Reed-Solomon encoder block would be performing the encoder function. The Execute state 803 lasts for a finite number of clock cycles. During the last Execute state, the decode signal goes active. When the decode signal goes active, this signals the following block that this block has completed its execution. Decode state 804 is executed next for one clock cycle. During Decode state 804, the busy and decode signals go inactive. Finally, the state machine goes back into the Idle state 801. It will remain in Idle state 801 until the start signal again goes active.

This state machine flow allows multiple blocks to be cascaded together without knowledge of how many clock cycles it takes each block to execute.

Reed-Solomon Control Block

Figure 9:
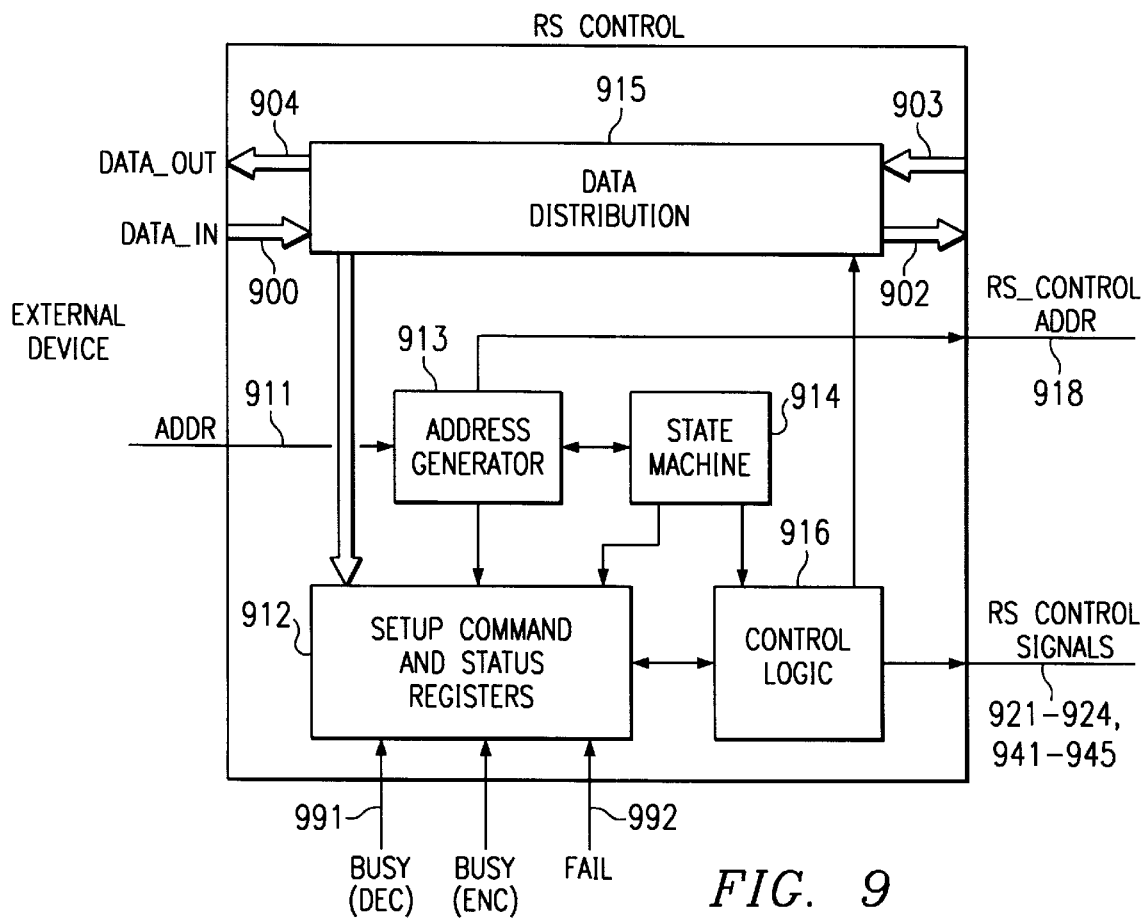
FIG. 9 is a Reed-Solomon control block of this invention.

Reed-Solomon control block 403 is shown in FIG. 9. The purpose of Reed-Solomon control block 403 is to control the interface between external devices and the Reed-Solomon encoder/decoder. The DATA_IN bus 900 is the input data bus from the external device. The ADDR bus 911 is source of external addresses from the external program source, DSP or CPU device. Reed-Solomon control block 403 contains all the addressable registers 912 including setup registers for both the encoder and the decoder, command and status registers. Reed-Solomon control block 403 also contains: address generator 913 for translation of the external address 911 for use within the Reed-Solomon encoder/decoder; state machine 914; data distribution network 915; and Reed-Solomon control logic 916.

Reed-Solomon control block 403 activates the encoder_setup_signals 921, enc_start 922, dec_setup_signals 923, and dec_start 924 signals: when the appropriate commands are issued. Each of these signals are active for one clock cycle. Data on DATA_IN bus. 900 from an external source (which may be either a DSP or a CPU) is written into or read from the data RAMs via Reed-Solomon control block data distribution interface 915. Reed-Solomon control block 403 generates all required RAM control signals 941, 942, 943, 944 and 945. Address generator 913 performs any necessary address translation for the Reed-Solomon encoder/decoder interface. RS_control_address signal 918 sends a RAM address to all encoder and decoder RAMS.

Reed-Solomon control block 403 receives inputs from the Reed-Solomon decoder 458. These signals include BUSY DEC signal 991 and fail signal 992 (702 and 778 of FIG. 7) from Reed-Solomon decoder 458. Reed-Solomon control block 403 generates the control signals for the Galois Field encoder setup block, the Galois Field decoder setup block, the encoder, the decoder and all the encoder and decoder RAMs using the pertinent address generator information and the register-stored program, command, signal, and status information within the bank of addressable registers and the condition of the state machine. Data from the data distributor is sent to Reed-Solomon encoder/decoder blocks via Reed-Solomon control block 403 DATA_OUT_ENC/DEC bus 902 and is returned to Reed-Solomon control block 430 via the DATA_RETURN bus 903. Processed data is sent to the external device via DATA_OUT bus 901.

The input/output signals of Reed-Solomon control block 403 are listed in Table 2 below.

TABLE 2

| Input Signals | Output Signals |
| --- | --- |
| CLK - clock signal | DATA_OUT - output data |
| RESET - reset | DATA_OUT_SIZE - output data bus size |
| ADDR - address | RS_VALID - data valid signal |
| DATA_IN - input date | READY - ready to send or receive data |
| PS - program space select | DEC_COMPLETE - decoder command complete |

TABLE 2-continued

| Input Signals | Output Signals |
| --- | --- |
| EN - enable signal | ENC_COMPLETE - encoder command complete |
| MSTRB - external memory access strobe | DATA_VALID - data valid and available to DSP |
| R/W read/not write signal | FAIL - decoder has failed to correct received code |

REED-SOLOMON ENCODER/DECODER RAMS

Figure 10A:
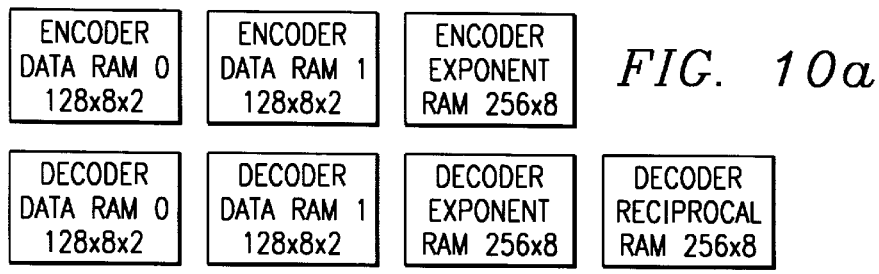
FIG. 10 illustrates Reed-Solomon RAM blocks of this invention.
Figure 10B:
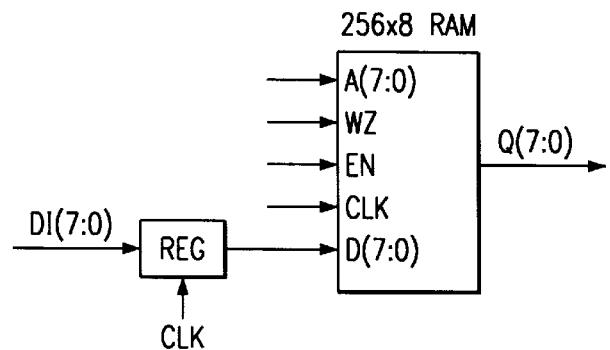

The Reed-Solomon encoder/decoder contains seven RAMs, 1006a, 1006b, 1007, 1008a, 1008b, 1009, and 1010. These correspond to RAM 406, 407, 408, 409, and 410 of FIG. 4 and are shown pictorially in FIG. 10a. There are two types of RAMs in this implementation. The first type is a 256 by 8-bit RAM. This first type RAM contains 256 byte locations and is shown in FIG. 10b. This first type RAM is used for the encoder exponent RAM, the decoder exponent RAM, and the decoder reciprocal RAM. The encoder exponent RAM is initialized by the encoder SETUP command. The decoder exponent RAM is initialized by the decoder SETUP command. All three of these RAMs can be read by addressing their addresses as shown in the FIG. 11. This memory has only an 8-bit mode.

Figure 10C:
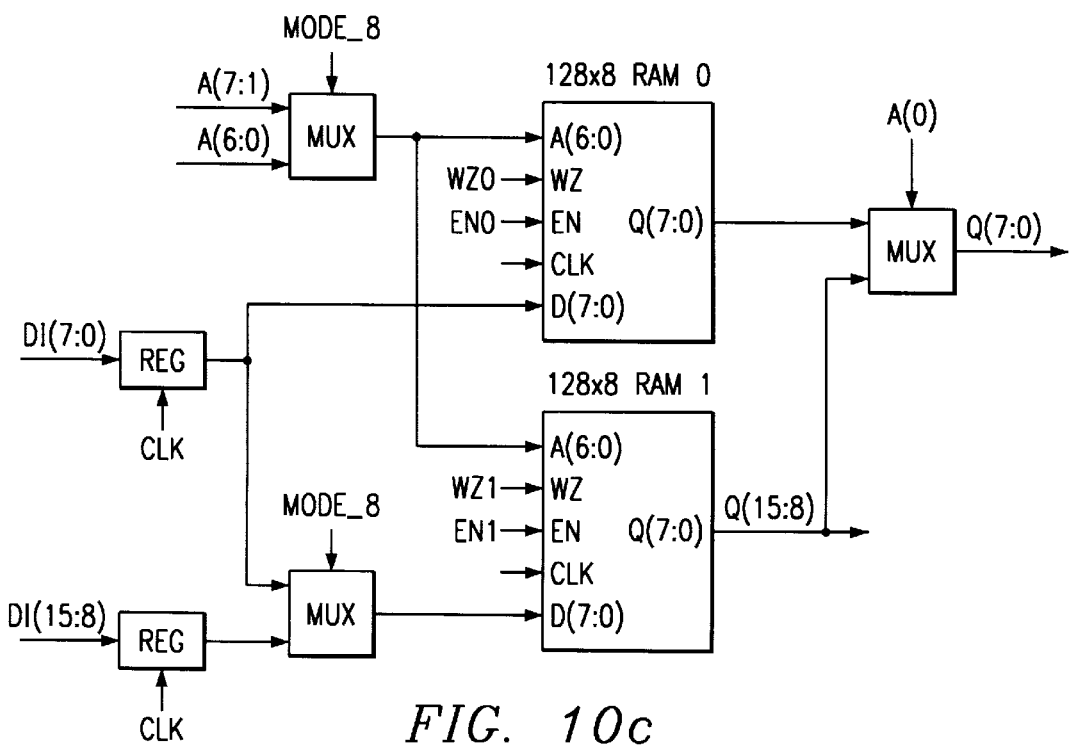

FIG. 10c shows the second type RAM as a 128 by 8-bit by 2 RAM. This second type RAM is used for the four data RAMS. It has both an 8-bit mode and a 16-bit mode. The 8-bit mode is used for data transfers while the Reed-Solomon encoder/decoder is either encoding or decoding. The 16-bit mode is used for data transfers which use the Reed-Solomon encoder/decoder interface. This 16-bit mode allows maximum data bandwidth for the DSP external memory interface of this embodiment. During 16-bit mode ADDR(0) controls which memory receives which data. The DATA_IN(15:0) and DATA_OUT(15:0) busses require that the even number symbols are placed on bits (7:0) and the odd number symbols are placed on bits (15:8). This means that in 16-bit mode RAM 0 will contain all the even symbols and RAM 1 will contain all the odd symbols.

GALOIS FIELD ENCODER SETUP BLOCK

The input/output signals of the Galois Field encoder setup block 422 illustrated FIG. 4 are listed in Table 3.

TABLE 3

| Input Signals | Output Signals |
| --- | --- |
| START | DEC_EXP_RAM controls |
| DECODER SETUP signals | DEC_RECIP_RAM controls |
| | γ |
| | EXPONENT |
| | BUSY |

After all of the Reed-Solomon encoder setup registers are initialized, this Galois Field encoder setup block 423 is ready for execution. The Reed-Solomon control block 403 activates the GF_ENC_SETUP signal 442 which is the start signal for this block. The start signal is active for one clock cycle.

Once the state machine of this block enters the execute state, this block initializes the encoder exponent RAM and calculates the γ coefficients. During the execute state the busy signal is active.

The initialization of the exponent RAM 406 depends on GF and p(x). The algorithm is described in the equation:

$$d_{i+1} = 2 \times d$$

where: d is the exponent RAM data and i is the exponent of the address for i=0 to GF−1. The initial data $d_0$ is set to a value of 1. After GF iterations, the remaining RAM addresses, GF to 255, are set to zero. It takes 256 clock cycles to complete initialization of the RAM.

After the exponent RAM is initialized, the generator polynomial is generated. The generator polynomial contains the γ coefficients γ(x) defined as:

$$\gamma(x) = \prod_{i=0}^{2t-1} (x - \alpha^{i-j_0})$$

where $j_0$ is an integer used to vary the result of γ(x) and expanding gives:

$$\gamma(x) = x^{2t} + \gamma_{2t-1} x^{2t-1} + \gamma_{2t-2} x^{2t-2} + \ldots \gamma_1 x + \gamma_0$$

Galois Field Decoder Setup Block

The input/output signals of the Galois Field decoder setup block 422 illustrated in FIG. 4 are listed in Table 4.

TABLE 4

| Input Signals | Output Signals |
| --- | --- |
| START | DEC_EXP_RAM controls |
| DECODER SETUP signals | DEC_RECIP_RAM controls |
| | β |
| | EXPONENT |
| | BUSY |

After all the Reed-Solomon decoder setup registers are initialized, the Galois Field decoder setup block 432 is ready for execution. The Reed-Solomon control block 403 activates the GF_DEC_setup signal 432 which is the start signal for this block. This start signal is active for one clock cycle.

Once the state machine of this block enters the execute state, this block initializes the decoder exponent RAM 409, calculates the exp coefficients, calculates the B coefficients, and initializes the decoder reciprocal RAM 410. During execution the busy signal is "high".

The initialization of the exponent RAM depends on GF and p(x). The algorithm is described in the equation:

$$d_{i-1} = 2 \times d$$

where: d is the exponent RAM data; and i is the exponent RAM address from i=0 to GF−1. The initial data $d_0$ is set to a value of "1". After GF iterations, the remaining RAM addresses GF to 255 are set to a value of "0". It takes 256 clock cycles to complete the initialization of the RAM.

The exp coefficients are the first t elements of the exponent RAM. While the exponent RAM is being initialized, the first t exp coefficients are being saved. This does not require any additional clock cycles. The exp coefficients are needed during the Chien Search operation.

The B coefficients are calculated next. The B coefficients are used by the syndrome accumulator. The value of β is given by:

$$\beta_i = d_{i+j_0}$$

where: $d_{i+j_0}$ is the data at that exponent RAM address; $i+j_0$ is equal to the exponent RAM address for i=0 to 2t−1.

Next, the B registers must be set to zero for (2t−1)<i<20. Twenty is the number of β coefficients for a t=10 code. This step takes 20 clock cycles.

The other task of the Galois Field decoder setup block 423 is to initialize the decoder reciprocal RAM 410. To find the reciprocal of an operand of the Galois Field, one must find its inverse, A×B=1 where B=A . This algorithm is an iterative approach.

Reed-Solomon Encoder and Encoder RAMs

The stand alone Reed-Solomon encoder block 457 is in FIG. 4. The start signal 435 and encoder setup signals 431 come from the Reed-Solomon control block 403. The encoder setup signals consist of GF, p(x), n, k, xtend, and se_mult. The 20 γ signals 436 come from the Galois Field encoder setup block 422. The start signal is an input from the state machine and the busy signal 437 is an output to the state machine. The encoder data RAMs 406, 407 receive the following signals from encoder block 457: RAM enable, RAM R/W, RAM data input, RAM data output and RAM address. The Reed-Solomon encoder block 457 reads data from and writes data to the encoder data RAM.

Once the encoder setup signals have been initialized and the encoder Galois Field setup command has completed, the 5 Reed-Solomon encoder block 457 is ready. The function of Reed-Solomon encoder block 457 is to calculate c(x). For systematic codes u(x) is defined as follows:

$$c(x) = x^{n-k} u(x) + REM\left[\frac{x^{n-k} u(x)}{\gamma(x)}\right]$$

γ(x) is defined as:

$$\gamma(x) = \prod_{i=0}^{2t-1} (x - \alpha^{i-j_0})$$

$j_0$ is an integer and is used to vary the result of γ(x) Because the code is systematic, Reed-Solomon encoder block 457 must calculate the polynomial division remainder. The remainder is called the parity check polynomial. The above equations are implemented with 20 parity check registers. Twenty registers are required for t=10 codes and 2t parity symbols are required.

Reed-Solomon Decoder and Decoder RAMs

Reed-Solomon decoder block 458 will be described in detail with reference to FIG. 7. This will illustrate more fully the interface between the crucial Reed-Solomon control block 403 of this invention with more conventional blocks (RAMs and the decoder blocks) which were adapted to this implementation.

The start signal 711 is an input from and the busy signal 702 is an output to the state machine. The decoder setup signals DEC_SETUP 442 come from Reed-Solomon control block 403. These include GF, p(x), n, k, t, xtend, and $j_0$. The β signal 443 and exp signal 444 come from the Galois Field setup block 423. The β signal 743 is a bus with 20 elements and the exp signal 744 is a bus with 10 elements. This is due to the t=10 specified capability of the design. The β signal 743 is used by the syndrome accumulator. The exp signal 744 is used by the Chien Search block 316. The Reed-Solomon decoder block 423 reads data from and writes data to the data RAM 708. The Reed-Solomon decoder block 423 only reads from the exponent 709 and reciprocal 710 RAMs. The controls for these three RAMs are included in the input and output signals of Reed-Solomon decoder block 458. Reed-Solomon decoders can fail and thus a fail 778 signal is included as an output of Reed-Solomon decoder block 458. Once the decoder setup signals have been initialized and the decoder Galois Field setup command has completed, Reed-Solomon decoder block 458 is ready for execution.

Figure 1:
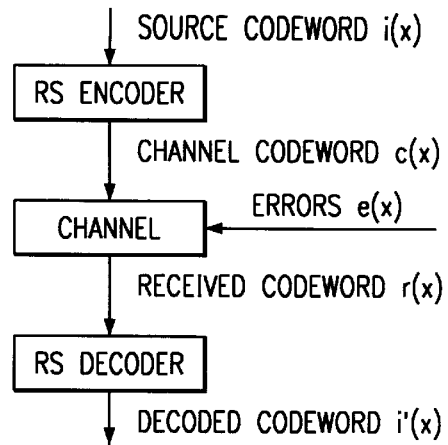
FIG. 1 is an overall system of Reed-Solomon encoder and decoder.
Figure 2:
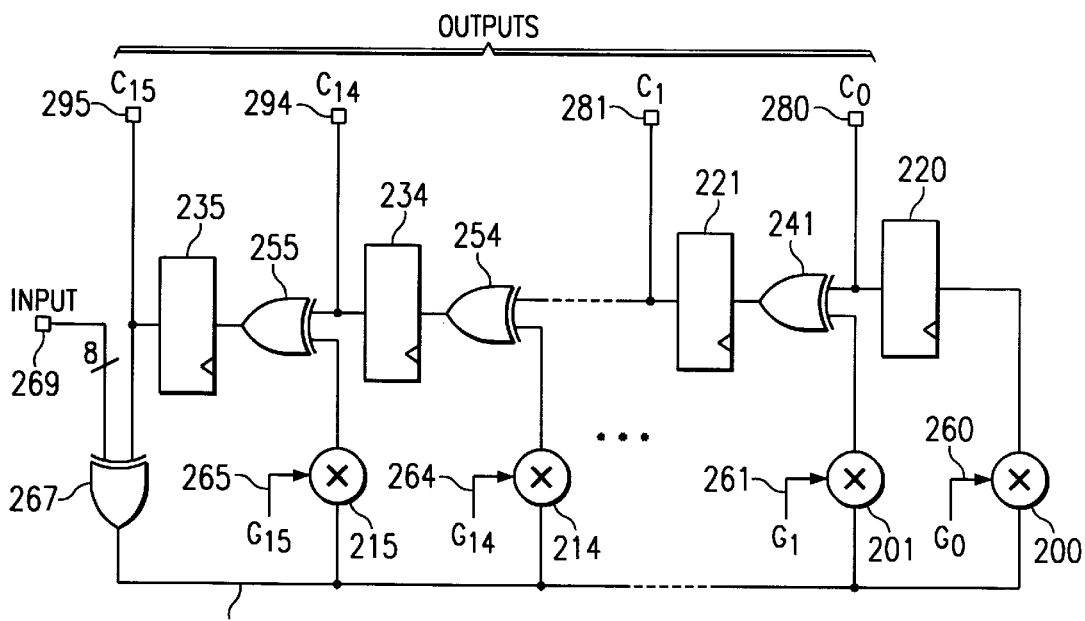
FIG. 2 is an electrical diagram, in schematic form, of a conventional Reed-Solomon encoder architecture.
Figure 3:
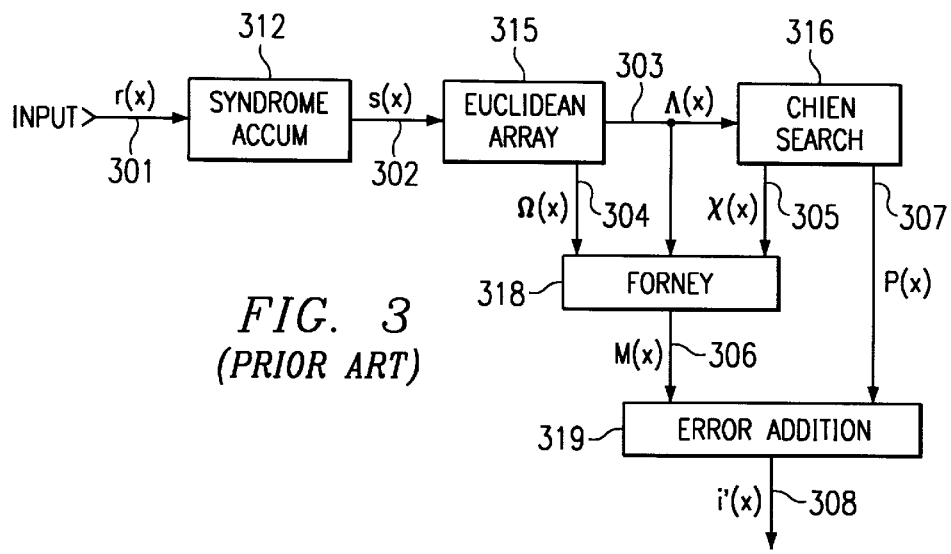
FIG. 3 is an electrical diagram, in block form, of a conventional Reed-Solomon decoder architecture.
Figure 7:
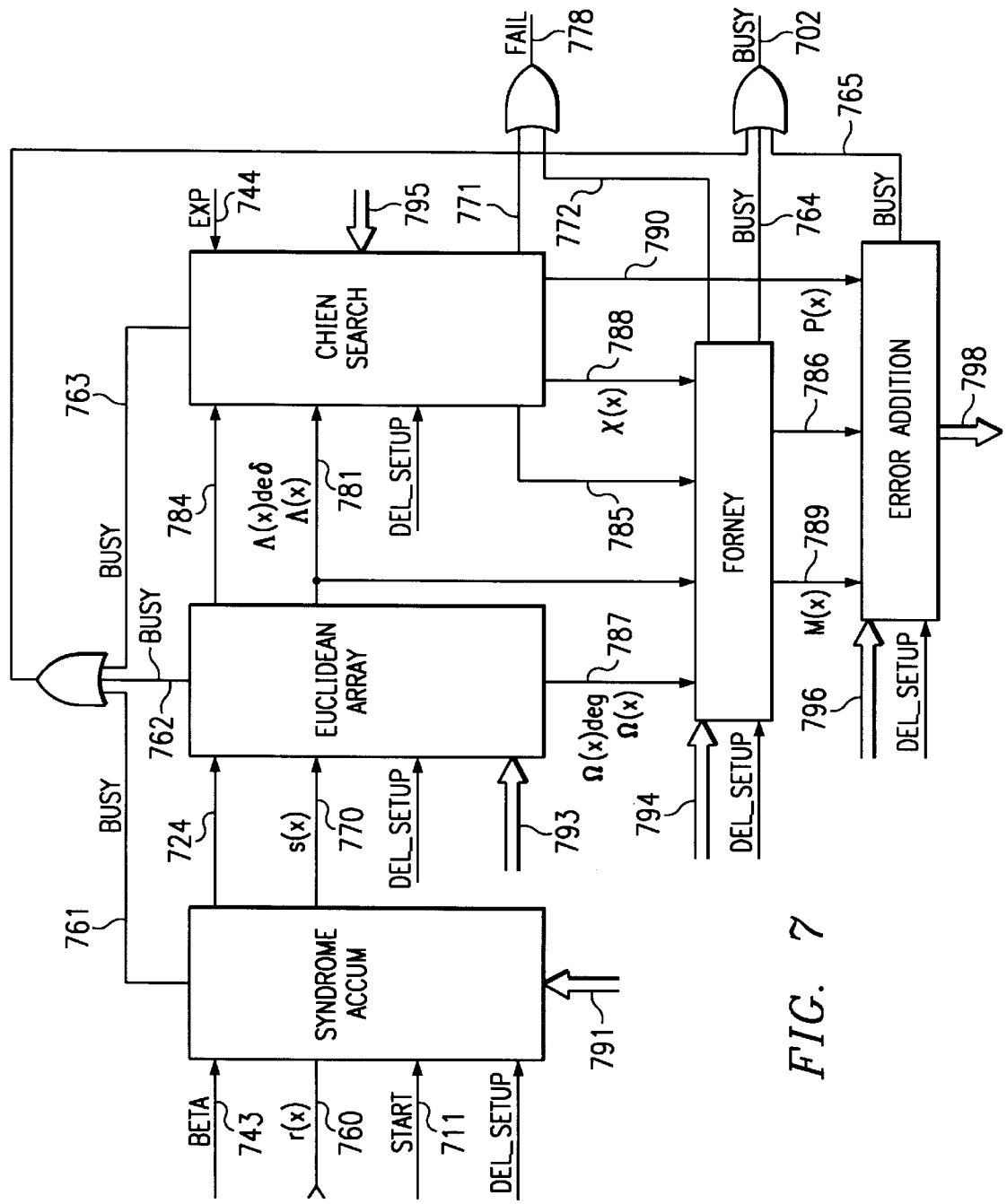
FIG. 7 illustrates the decoder architecture with specific modifications for this invention.

FIG. 7 shows the connection of the major signals. Each block can be executed in series as shown in FIG 3. The syndrome accumulator receives the Reed-Solomon decoder start signal 711 and starts execution. The syndrome accumulator busy signal 761 is active during execution. The other blocks are in an idle state. When the syndrome accumulator is finished, the decode signal 724 goes active for one clock cycle. Euclidean array block 315 treats this signal as its start signal 724. Euclidean array block 315 executes its function and the other blocks are in the idle state. This sequence of operations repeats until Error Addition block 319 completes. During the execution of these five blocks, the Reed-Solomon decoder busy signal 702 is active. The Reed-Solomon decoder busy signal 702 is a logical OR of the five individual busy signals from the decoder blocks. This Reed-Solomon decoder busy signal 702 is output from the Reed-Solomon encoder/decoder to the external device or DSP. This signal informs the external device or DSP that the Reed-Solomon encoder/decoder is busy decoding the received codeword.

The task of the Reed-Solomon decoder is to process the received codeword r(x), generate the error polynomial e(x), correct the t errors, and output the decoded codeword i'(x). There are n symbols in r(x) and k symbols in i'(x). The error polynomial is defined as:

$$e(x) = M_1 x^{P_1} + M_2 x^{P_2} + \ldots + M_m x^{P_m}$$

where: $M_i$ is equal to the error magnitudes; and Pi is equal to the error positions.

Syndrome Accumulator Block

The input/output signals of Syndrome Accumulator block 312 are listed in Table 5.

TABLE 5

| Input Signals | Output Signals |
| --- | --- |
| START | BUSY |
| β | DECODE |
| DECODER SETUP signals | s (X) |
| DECODER Data RAM Input | DECODER Data RAM Controls |

The syndrome accumulator reads data from the decoder data RAM. The data RAM control signals consist of address and enable. The data RAM input is the data from the received polynomial.

The syndrome accumulator calculates the syndrome address, labeled s(x) 770 in FIG. 7. There are 20 syndrome registers. After processing all the elements of r(x), the syndrome values are used to determine if errors are present in r(x). If all syndromes are zero, then no errors occurred. The equation for determining the syndromes is:

$$s(i) = s(i) \times b(i) + DATA$$

for i=0 up to 2t−1.

Euclidean Array Block

The input/output signals of Euclidean array block 315 are listed in Table 6.

TABLE 6

| Input Signals | Output Signals |
| --- | --- |
| Start | BUSY |
| s (x) | DECODE |

TABLE 6-continued

| Input Signals | Output Signals |
| --- | --- |
| DECODER SETUP Signals | Λ Degree |
|  | Λ |
|  | Ω Degree |
|  | Ω |
| DECODER EXP RAM Input | DEC RECIP RAM Controls |

The start signal is an input from the state machine and the busy signal is an output to the state machine. The decoder setup signals consist of GF, p(x), and t. These signals are stored in the Reed-Solomon control block 403. Euclidean array block 315 reads the decoder reciprocal RAM and this data signal is labeled 793 in FIG. 7. The reciprocal RAM signals are data, address, and enable. The s(x) signal consists of 20 symbols and is stored in the syndrome accumulator block.

The function of Euclidean array block 315 is to calculate Λ(x) and the degree of Λ(x) 781, Ω(x) and the degree of Ω(x) 782. Λ(x) is of the form:

$$\Lambda(x) = \Lambda_0 + \Lambda_1 x + \Lambda_2 x^2 + \ldots + \Lambda_m x^m$$

and Ω(x) is of the form:

$$\Omega(x) = \Omega_0 + \Omega_1 x + \Omega_2 x^2 + \ldots + \Omega_{m-1} x^{m-1}$$

The degree of Λ(x) is equal to v and the degree of Ω(x) is equal to v−1. This v is equal to the number of errors in r(x) and v≦t for proper decoding.

Chien Search Block

The input/output signals of Chien Search block 316 are listed in Table 7.

TABLE 7

| Input Signals | Output Signals |
| --- | --- |
| Start | BUSY |
| EXPONENT | DECODE |
| Λ Degree | FAIL |
| Λ | Zeros |
| DECODER SETUP Signals | ERROR Positions |
| DECODER EXP RAM Input | DEC EXP RAM Controls |

The start signal 784 is an input from the state machine and the busy signal 763 is an output to the state machine. The decoder setup signals consist of GF, p(x), n, t and xtend.

These signals are stored in the Reed-Solomon control block 403. Chien Search block 316 will read the decoder exponent RAM block. The exponent RAM signals are data, address, and enable. The EXPONENT signal consists of 10 symbols and is stored in the Galois Field decoder setup block. The Λ and the degree of Λ are generated by Euclidean array block 315.

The function of Chien Search block 316 is to generate the zeros signals X(x) 788 and the error positions P(x) 790. The X(x) 788 will be used by Forney block 318 and the P(x) 790 will be used by the error addition block.

Chien Search block 316 can notify the user of failures with the fail signal 778.

Forney Block

The input/output signals of Forney block 318 are listed in Table 8.

TABLE 8

| Input Signals | Output Signals |
| --- | --- |
| START | BUSY |
| Zeros | DECODE |
| Λ Degree | FAIL |
| Λ | ERROR Magnitudes |
| Ω Degree | |
| Ω | |
| DECODER SETUP Signals | |
| DEC RECIP RAM Input | DECODER RECIP RAM Controls |

The start signal 785 is an input from the state machine and the busy signal 764 is an output to the state machine. The decoder setup signals consist of GF, p(x), and $j_0$. These signals are stored in the Reed-Solomon control block 403. Forney block 318 reads the decoder reciprocal RAM block labeled RECIP in FIG. 7. The reciprocal RAM signals are data, address, and enable. The EXPONENT signal consists of 10 symbols and is stored in the Galois Field decoder setup block 423. The Λ(x), the degree of Λ(x), Ω(x) and the degree of Ω(x) are generated by Euclidean array block 315. The X(x) and the zeros are generated by Chien Search block 316.

Forney block 318 generates the error magnitudes M(x) M(x) is defined by $$M(x) = \frac{\Omega(X(i)^{-1})}{X(i)^{i-j_0}\Lambda(X(i)^{-1})}$$

for i=1 to v.

Error Addition Block

The input/output signals of Error Addition block 319 are listed in Table 9.

TABLE 9

| Input Signals | Output Signals |
| --- | --- |
| Start | BUSY |
| Zeros | DECODE |
| ERROR Positions | FAIL |
| ERROR Magnitudes | |
| FAIL | |
| DECODER SETUP Signals | |
| DEC DATA RAM Controls | |

The start signal 786 is an input from Forney block 318, and the busy signal 765 is an output to the state machine. The decoder setup signals consist of "n" and "t". These signals are stored in the Reed-Solomon control block 403. Error Addition block 319 reads and writes data from the decoder RAM. The data RAM signals are RAM data input 796, RAM data output 798, RAM address 751, RAM enable 752, and RAM read/write control 753. The error positions, P(x) 790, from Chien Search block 316 and the error magnitudes, M(x) 789, from Forney block 318 are inputs to Error Addition block 319. The fail signal 778 is a logical OR of the fail signals from Chien Search block 316 and Forney block 318. The function of Error Addition block 319 is to add M(x) to the data stored in the decoder RAM at location n−1−P(i). This is repeated for all i from i=0 to t−1. If the fail signal is active, then the value of zero is added to the data in the RAM.

Programmability and Reconfigurability

Figure 5:
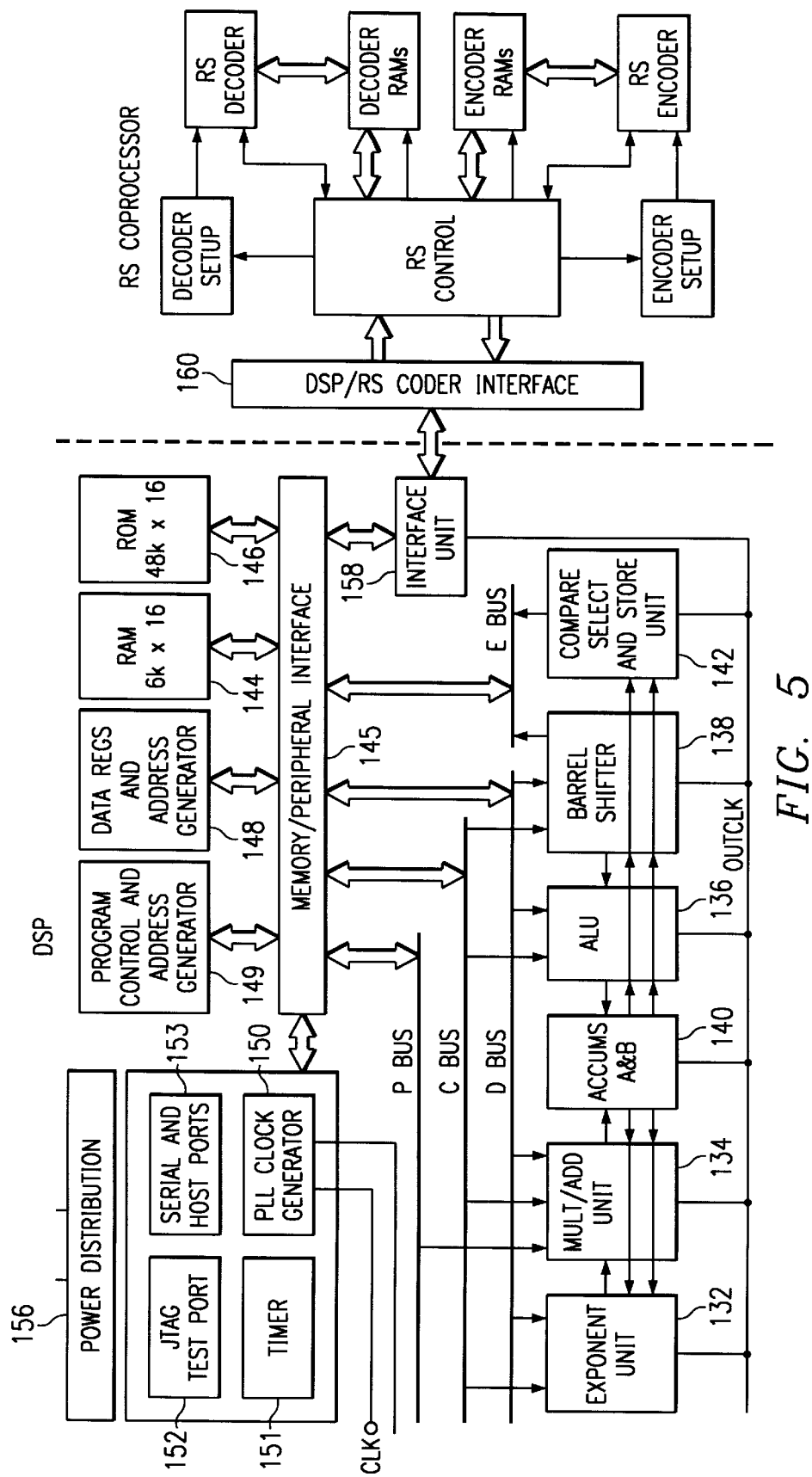
FIG. 5 is a DSP chip with a Reed-Solomon encoder/decoder coprocessor constructed according to a second embodiment of this invention.
Figure 6:
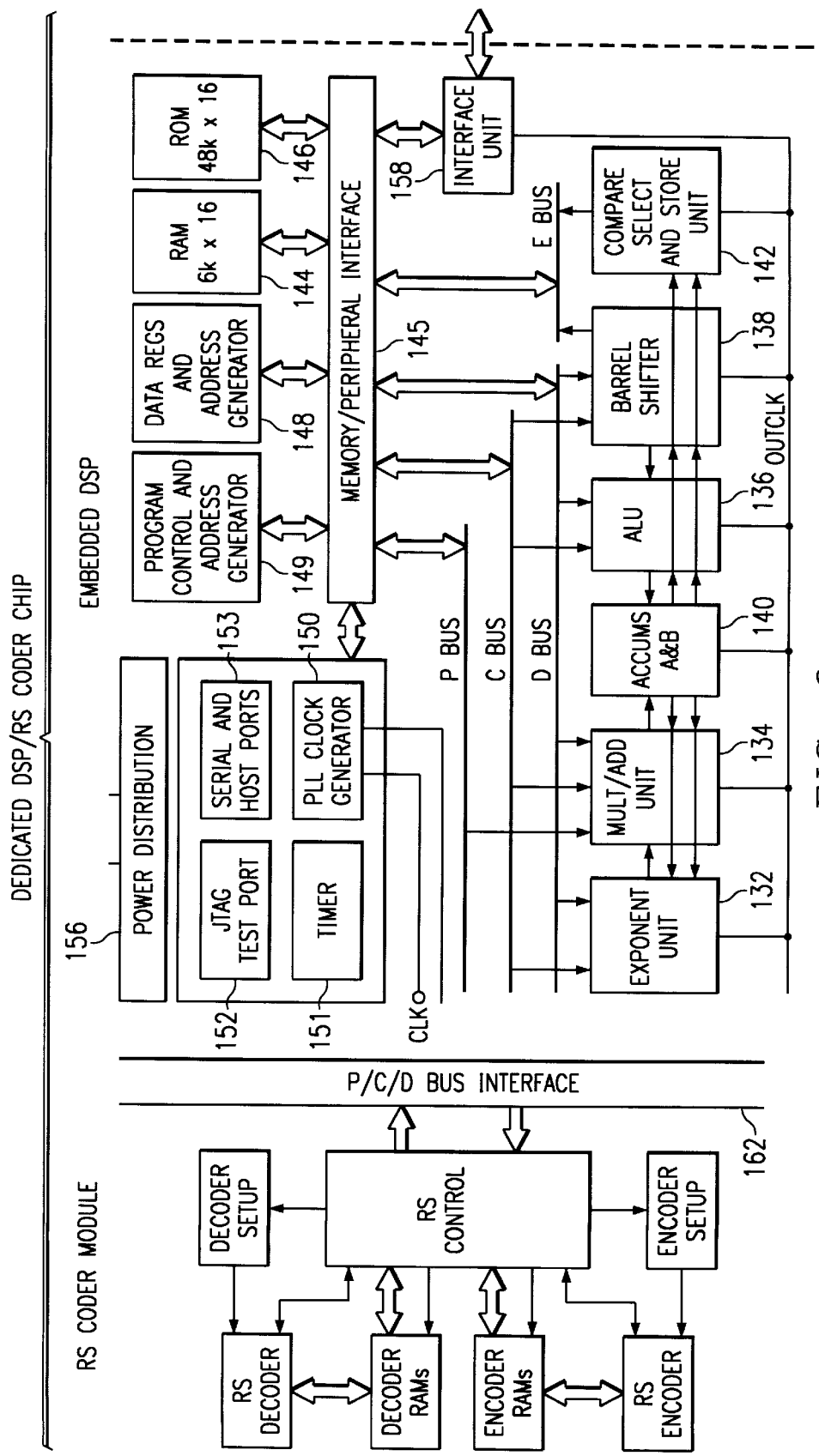
FIG. 6 is a custom DSP chip with this interface internally placed between the Reed-Solomon encoder/decoder and the embedded DSP according to a third embodiment of this invention.

Having described an implementation this invention, the invention can be contained in an architectures of either FIG. 4, FIG. 5 or FIG. 6.

It is desirable, for programming ease and for flexibility of reconfiguring, to reduce the set of Reed-Solomon commands, both initialization commands and execute commands to operations proceeding from addressable registers. This allows for extremely straightforward programming and the only user input required becomes the simple code to direct the encoder/decoder to carry out a sequence of operations based on four signal inputs per line of code. These signal inputs are: EN; R/W; ADDR; and DATA_IN.

Reed-Solomon Address Map

The Reed-Solomon encoder/decoder of this invention preferably uses a 2K address range controlled by the ADDR (10:0) bus. The 2K address range is divided into sixteen 128 size locations as shown in the table of FIG. 11. The sixteen regions in the memory map access either 8 or 16-bit data as shown in the table of FIG. 11. The 11 bits of the ADDR bus are defined in the table of FIG. 11. ADDR(6:0) define the individual registers for both the encoder and the decoder. The table in FIG. 11 shows the register addresses.

Reed-Solomon Commands

The Reed-Solomon commands consist of four types of commands: setup commands for the encoder; setup commands for the decoder; execution commands for the encoder; and execution commands for the decoder. The setup commands act to initialize the following registers (the addresses of these registers is given in FIG. 11):

Reed-Solomon Encoder Setup Registers

1. GF—This register contains the Galois Field used for encoding. Valid values for GF are 8, 16, 32, 64, 128, and 256.

2. PPOLY—This register contains the primitive polynomial p(x) for the encoder. For example, for GF(256), p(x) 285. This corresponds to:

$p(x)=x^8+x^4+x^3+x^2+1$

3. N—This register contains n for the encoder. This n is the number of symbols in the channel codeword c(x). For regular Reed-Solomon codes n=GF−1. Valid values range from 3 to GF−2 for shortened codes. For single extended codes, valid values equal GF.

4. K—This register contains k for the encoder. This k is the number of symbols in the source codeword i(x)

5. XTEND—This register specifies the type of Reed-Solomon encoding. A value of 1 is equal to single extended codes and a value of 0 is equal to regular and shortened codes.

6. J0—This register is used to define the generator polynomial $j_0$ for the encoder used in the following equation. Valid values of $j_0$ range from 0 to 2, where:

$$\gamma(x) = \prod_{i=0}^{2t-1}(x-\alpha^{j+j_0})$$

7. SE_MULT—This. register contains the initial single extended multiplier register used in single extended codes. Valid values are equal to any valid symbol of the appropriate Galois Field. If single extended codes are not used, this register is set to "0".

Reed-Solomon Decoder Setup Registers

1. GF—This register contains the Galois Field used for decoding. Valid values for GF are 8, 16, 32, 64, 128, and 256.

2. PPOLY—This register contains the primitive polynomial p(x) for the decoder. For example, for GF(256) p(x) 361. This corresponds to $p(x)=x^8+x^6+x^5+x^3+1$.

3. N—This register contains n for the decoder. This n is the number of symbols in the received codeword r(x). For regular Reed-Solomon codes n=GF−1. Valid values range from 3 to GF−2 for shortened codes. For single extended codes, valid values equal GF.

4. K—This register contains k for the decoder. This k is the number of symbols in the source codeword i(x). Valid values range from 1 to 253 where k<n and k=n−2t.

5. T—This register contains t for the decoder. This t is the number of errors in the received codeword r(x). Valid values range from 1 to 10 and t=(n−k)/2.

6. XTEND—This register specifies the type of Reed-Solomon decoding. A value of 1 is equal to single extended codes and a value of 0 is equal to regular and shortened codes.

7. J0—This register is used to define the generator polynomial, $j_0$, for the decoder used in the following equation. The decoded syndrome accumulator uses $j_0$ to generate the γ(x) according to the equation The execute commands for the Reed-Solomon Encoder and the Reed-Solomon decoder are as follows:

$$\gamma(x) = \prod_{i=0}^{2t-1} (x - a^{i+j_0})$$

Description of Reed-Solomon Commands

1. EXECUTE0—The Reed-Solomon encoder/decoder performs either Reed-Solomon encoding or Reed-Solomon decoding. The functional block uses the data stored in either the encoder data RAM 0 or the decoder data RAM 0.

2. BLK_WR0—A DMA block transfer of data will be written to data RAM 0. A number k symbols are written to the encoder data RAM 0 or n symbols are written to the decoder data RAM. The data is transferred 16 bits at a time. The bus bits DATA_IN(7:0) contain the even symbols and the bus bits DATA_IN(15:8) contain the odd symbols. For example, the first 4 data symbols are labeled s(0), s(1), s(2) and s(3). Each symbol contains 8 bits. The first 16 bits data transfer is s(1)s(0). The second 16 bit transfer is s(3)s(2).

3. BLK_WR0_EX0—A DMA block transfer of data is written to data RAM 0. A number k symbols are written to the encoder RAM 0 or n symbols are written to the decoder RAM 0. The data is transferred 16 bits at a time. The bus bits DATA_IN(7:0) contains the even symbols and the bus bits DATA_IN(15:8) contain the odd symbols. Immediately following the data transfer either the encoder or the decoder starts to execute using the data in data RAM 0.

4. BLK_RD0—A DMA block transfer of data is read from data RAM 0. A number n−k symbols are read from the decoder RAM 0. The data is transferred 16 bits at a time. The bus bits DATA_IN(7:0) contains the even symbols and the bus bits DATA_IN(15:8) contain the odd symbols. If n or k is an odd number, then an extra clock cycle might be required. For example, an Reed-Solomon (255,235) code would have the following encoded parity symbols: s(253) and s(254). The first 16 bits DATA_OUT(15:0) output on the data bus would be s(253), s(252). The next data output would be s(255), s(254).

5. EXECUTE1—The Reed-Solomon encoder/decoder performs either Reed-Solomon encoding or Reed-Solomon decoding. The functional block uses data stored in either the encoder data RAM 1 or the decoder data RAM 1.

6. BLK_WR1—A DMA block transfer of data is written to decoder RAM 1. A number k symbols are written to the encoder RAM 1 or n symbols are written to the decoder RAM 1. The data is transferred 16 bits at a time. The bus bits DATA_IN(7:0) contains the even symbols and the bus bits DATA_IN(15:8) contain the odd symbols.

7. BLK_WR1_EX1—A DMA block transfer of data is written to data RAM 1. A number k symbols are written to the encoder RAM 1 or n symbols are written to the decoder RAM 1. The data is transferred 16 bits at a time. The bus bits DATA_IN(7:0) contains the even symbols and the bus bits DATA_IN(15:8) contain the odd symbols. Immediately following the data transfer either the encoder or the decoder starts to execute using the data in data RAM 1.

8. BLK_RD1—A DMA block transfer of data is read from data RAM 1. A number n−k symbols are read from the encoder RAM 1 or k symbols are read from the decoder RAM 1. The data is transferred 16 bits at a time. The bus bits DATA_IN(7:0) contains the even symbols and the bus bits DATA_IN(15:8) contain the odd symbols. If n or k is an odd number, then an extra clock cycle might be required.

9. SETUP—This command starts either the encoder or decoder setup routine. The encoder setup routine initializes the encoder exponent RAM, and the y polynomials. The decoder setup routine initializes the decoder exponent RAM, the decoder reciprocal RAM, β polynomial, and exp polynomial.

Reed-Solomon Command Registers

Both the encoder and the decoder have three command registers. These are: COMMAND1 register, COMMAND2 register and RESET register. Selection of the command registers is made via the ADDR bus. The data written to the command registers is from the DATA_IN bus. The data read from the command registers is sent to the DATA_OUT bus. Writing to either the encoder RESET register or the decoder RESET register causes that respective encoder or decoder to reset. Reset is active for one clock cycle.

The two command registers for both the encoder and the decoder are six-bit registers. The four least significant bits of the command registers correspond to the command opcode. Command bit 4 corresponds to enable status completion signal and command bit 5 corresponds to the enable status completion register. The status completion signal is used for hardware interrupts and the status completion register is used for software interrupts or polling.

COMMAND1 register can execute all the commands; COMMAND2 register can execute only the DMA block transfer commands. Both command registers can be executing at the same time as long as only one of them is performing a DMA block transfer. This is because there is only one DATA_IN bus and only one DATA_OUT bus. Both the encoder COMMAND1 register and the decoder COMMAND1 register can perform an EXECUTE command at the same time. Either the encoder COMMAND2 register or the decoder COMMAND2 register can perform a DMA block transfer. This means that the Reed-Solomon encoder/decoder can perform three functions at the same time.

Whenever a DSP is performing a DMA block transfer, it must change the address bus to point to the DMA address. The DMA address is 0x000 for the encoder and 0x400 for the decoder.

Reed-Solomon Command Status

An external device determines the execution status of the Reed-Solomon encoder/decoder by reading the status registers. The STATUS1 register corresponds to the COMMAND1 register, and the STATUS2 register corresponds to the COMMAND2 register. Both the encoder and the decoder have these two registers. The status registers are enabled by writing a "0" to the enable status completion register bit of the respective command register. There are six bits in the command register (5:0) and the enable status completion register bit is bit 5. A value of "1" in on of the STATUS registers indicates that a command for that function (encode or decode) has not completed or the enable status completion register was not enabled.

If the enable status completion register was enabled, then a "0" will be written to the STATUS register when the command has completed execution. If the enable status completion register was not enabled, then no status of completion will be provided. The STATUS register will remain at "0" until the STATUS register is reset.

The STATUS register is reset by writing a "1" into it. If the STATUS register is not reset for each enabled COMMAND, then the STATUS register will go to a "0" state for the first COMMAND and stay low for each succeeding COMMAND. At this point the user will know only the status of the first command and the status of the other commands will be unknown. Therefore, it is important to reset the STATUS register between commands which enable the enable status completion register.

Programming and Reconfiguring the Reed-Solomon encoder/decoder

In this invention the programming and reconfiguring of the Reed-Solomon encoder/decoder is accomplished by way of addressable register command statements. These statements are assembly code which is a part of a code module which may be merely replaced when a new Reed-Solomon encoder/decoder having an entirely new set of parameters is desired. In the preferred embodiment of a stand-alone Reed-Solomon encoder/decoder, the code would be supplied by external hardware such as a programming board or an application module. This code could be entered by the user or could be resident in an external programming device such as a FLASH memory and entered by a boot process.

In the second embodiments where the Reed-Solomon encoder/decoder is a coprocessor operating in conjunction with a DSP or in the third embodiment where the Reed-Solomon encoder/decoder is on a dedicated chip with an embedded DSP, the programming process would proceed along the lines of DSP software development.

DSP Software Development

The process of software development for a conventional DSP solution to a typical Reed-Solomon encoder/decoder application would proceed as follows:

1. Review the full recommended code development process of the parent DSP chip. These recommendations will involve a choice of programming in the C language or an Assembly language which uses commands pertinent to the DSP being used.

2. Coding in C or DSP Assembly Language to describe the Reed-Solomon encoder/decoder functions.

3. Compiling C code to obtain an assembly language output and possibly optimize the assembly code before linking.

4. Linking the executable assembly language files, yielding an "xxx.out" file ready for debugging.

5. Initially debugging. This initial debugging process is a simulation in software only using a conventional software simulator.

6. Hardware debugging. This hardware debugging could involve at least a partial hardware simulation. The choices here would be: (1) to use an evaluation module with the DSP on board; or (2) to use an emulation module in conjunction with the user's target board (the actual application hardware board with a DSP).

These six steps are completed with the additional code added for the specific Reed-Solomon encoder/decoder application. The Reed-Solomon encoder/decoder hardware is controlled in integrated form for embodiments with an embedded DSP. The Reed-Solomon encoder/decoder hardware is controlled in partitioned form for embodiments including a standard DSP plus a Reed-Solomon encoder/decoder coprocessor. This yields the basic reprogrammable, reconfigurable Reed-Solomon encoder/decoder.

Programming via Addressable Registers

In this invention the Reed-Solomon encoder/decoder is implemented and the hardware is debugged. This leaves only one step to achieving successful application, the entry of the correct code for the device. When the Reed-Solomon encoder/decoder is a stand alone device, this is accomplished by way of the external programming software and hardware. When the Reed-Solomon encoder/decoder is coupled to a DSP, the code may be entered through DSP software adapted to provide entry into a special code module. In either case the assembly code carries out the process described by the two flow charts of FIGS. 12 and 13. These describe programming for an encoder and a decoder respectively.

As an example, to program the Reed-Solomon decoder, assume GF=128, RS(n,k,t)=RS(128,122,3), single extended code, and p(x)=x7+x3+1, j0=1, and SE_MULT=19.

The portion of the pseudo code of the decoder programming steps 1301 through 1309 of FIG. 13 would be as follows (note all address and data value references are in hexadecimal):

1301 Reset Reed-Solomon Decoder by Writing to RESET Command Register

| to | RESET; DATA_IN = 0000 | run 1 clock cycle |
|---|---|---|
| Read from RESET command register | | |
| from | RESET; DATA_CUT = 0001 | run 1 clock cycle |

1302 Initialize Reed-Solomon Decoder Setup Registers by Writing

| to | GF; DATA_IN = 0080 | run 1 clock cycle |
|---|---|---|
| to | PPOLY; DATA_IN = 0089 | run 1 clock cycle |
| to | N; DATA_IN = 0080 | run 1 clock cycle |
| to | K; DATA_IN = 007A | run 1 clock cycle |
| to | T; DATA_IN = 0003 | run 1 clock cycle |
| to | XTEND; DATA_IN = 0001 | run 1 clock cycle |
| to | J0; DATA_IN = 0001 | run 1 clock cycle |
| 7 total cycles to initialize all setup registers | | |

1303 Execute the Reed-Solomon Decoder Setup Command by Writing to the COMMAND1 Register to COMMAND1; DATA_IN=00D8 run 1 clock cycle Read STATUS1 register an additional 8533 cycles to complete decoder setup from STATUS1; DATA_OUT=0001 run 8533 clock cycles After 8533 cycles an additional read STATUS1 register from STATUS1; DATA_OUT=0000 run 1 clock cycle

1304 Reset the Reed-Solomon Decoder STATUS1 Register by Writing to STATUS1; DATA_IN=0001 run 1 clock cycle

1305 Write a block of Data to Decoder Data RAM with Decoder COMMAND2 Register

| to | COMMAND2; DATA_IN = 0035 | run 1 clock cycle |
|---|---|---|
| to | DMA; DATA_IN = 0201 | run additional 127 |
| to | DMA; DATA_IN = 0403 | clock cycles loading symbol data |
| to | DMA; DATA_IN - 0650 | ... |
| ... | | ... |
| to | DMA; DATA_IN - 807F | |

1306 Execute the Reed-Solomon Decoder Using the COMMAND1 Register and Enable Status Completion Signal to COMMAND1; DATA_IN=0000 run 1 clock cycle wait 1,816 clock cycles, until DEC_COMPLETE signal is inactive

1307 Reset the SIGNAL1 Register, DEC_COMPLETE Signal Will Go Active
 to SIGNAL1; DATA_IN=0001
1308 Read a Block of Data From the Decoder Data RAM with Decoder COMMAND1 Register

| to   | COMMAND1; DATA_IN = 0033, | run 1 clock cycle |
| from | DMA; DATA_IN = 0201 | run additional 122 |
| from | DMA; DATA_IN = 0403 | clock cycles reading |
| from | DMA; DATA_IN - 0650 | symbol data |
| ... | | ... |
| from | DMA; DATA_IN - 7A79 | |

1309 If Response to "Another Block?" is "Yes", then Repeat Steps 1305 through 1308

This concludes the description of this invention.

What is claimed is:

1. A Reed-Solomon encoder/decoder apparatus comprising:
 a decoder setup block having a first writable register storing decode a Galois field order and a second writable register storing an indication of a decode primitive polynomial;
 a decoder block receiving Reed-Solomon coded input data and connected to said decoder setup block, said decoder block decoding said Reed-Solomon coded input data according to said decode Galois field order stored in said first writable register and said indication of a decode primitive polynomial stored in said second writable register, and outputting decoded data;
 an encoder setup block having a third writable register storing an encode Galois field order and a fourth writable register storing an indication of an encode primitive polynomial; and
 an encoder block receiving input data and connected to said encoder setup block, said encoder block Reed-Solomon encoding said input data according to said encode Galois field order stored in said third writable register and said indication of an encode primitive polynomial stored in said fourth writable register, and outputting encoded data.

2. The Reed-Solomon encoder/decoder apparatus of claim 1, wherein:
 said first writable register stores an indication of decode Galois Field order selected from among the set including 8, 16, 32, 54, 128 and 256; and
 said third writable register stores an indication of encode Galois Field order selected from among the set including 8, 16, 32, 54, 128 and 256.

3. The Reed-Solomon encoder/decoder apparatus of claim 1, wherein:
 said decoder setup block further includes a fifth writable register storing a number of symbols per input data codeword; and
 said decoder block decodes said Reed-Solomon coded input data according to said number of symbols per input data codeword stored in said fifth writable register.

4. The Reed-Solomon encoder/decoder apparatus of claim 3, wherein:
 said decode setup block further includes a sixth writable register storing a number of symbols per source codeword; and
 said decoder block decodes said Reed-Solomon coded input data according to said number of symbols per source codeword stored in said sixth writable register.

5. The Reed-Solomon encoder/decoder apparatus of claim 1, wherein:
 said encoder setup block further includes a fifth writable register storing a number of symbols per encoded codeword; and
 said encoder block encodes said input data according to said number of symbols per encoded codeword stored in said fifth writable register.

6. The Reed-Solomon encoder/decoder apparatus of claim 5, wherein:
 said encode setup block further includes a sixth writable register storing a number of symbols per source codeword; and
 said encoder block encodes said input data according to said number of symbols per source codeword stored in said sixth writable register.

7. The Reed-Solomon encoder/decoder apparatus of claim 1, wherein:
 said decoder setup block further includes a fifth writable register storing a indication of a generator polynomial; and
 said decoder block decodes said Reed-Solomon coded input data according to said indication of a generator polynomial stored in said fifth writable register.

8. The Reed-Solomon encoder/decoder apparatus of claim 1, wherein:
 said encoder setup block further includes a fifth writable register storing a indication of a generator polynomial; and
 said encoder block encodes said input data according to said indication of a generator polynomial stored in said fifth writable register.

9. A Reed-Solomon encoder/decoder system comprising:
 a digital signal processor including:
  an arithmetic logic unit for performing addition, subtraction and logical operations,
  an integer multiplier unit,
  a data address generator for generating data addresses within a data address space for data employed by said digital signal processor,
  a program address generator for generating instructions addresses within an instruction address space for program instructions employed by said digital signal processor,
  a memory interface unit connected to said data address generator and said program address generator for accessing an external memory at said data addresses and said instruction addresses, and
  a program control unit responsive to program instructions recalled from a program memory in response to instruction addresses for. controlling operation of said digital signal processor;
 a Reed-Solomon encoder/decoder coprocessor including:
  a decoder setup block having a first writable register storing decode a Galois field order and a second writable register storing an indication of a decode primitive polynomial,
  a decoder block receiving Reed-Solomon coded input data and connected to said decoder setup block, said decoder block decoding said Reed-Solomon coded input data according to said decode Galois field order stored in said first writable register and said indication of a decode primitive polynomial stored in said second writable register, and outputting decoded data, an encoder setup block having a third writable register storing an encode Galois field order and a fourth writable register storing an indication of an encode primitive polynomial, and an encoder block receiving input data and connected to said encoder setup block, said encoder block Reed-Solomon encoding said input data according to said encode Galois field order stored in said third writable register and said indication of an encode primitive polynomial stored in said fourth writable register, and outputting encoded data.

10. The Reed-Solomon encoder/decoder system of claim 9, wherein:

said first writable register stores an indication of decode Galois Field order selected from among the set including 8, 16, 32, 54, 128 and 256; and said third writable register stores an indication of encode Galois Field order selected from among the set including 8, 16, 32, 54, 128 and 256.

11. The Reed-Solomon encoder/decoder system of claim 9, wherein:

said decoder setup block further includes a fifth writable register storing a number of symbols per input data codeword; and said decoder block decodes said Reed-Solomon coded input data according to said number of symbols per input data codeword stored in said fifth writable register.

12. The Reed-Solomon encoder/decoder system of claim 11, wherein:

said decode setup block further includes a sixth writable register storing a number of symbols per source codeword; and said decoder block decodes said Reed-Solomon coded input data according to said number of symbols per source codeword stored in said sixth writable register.

13. The Reed-Solomon encoder/decoder system of claim 9, wherein:

said encoder setup block further includes a fifth writable register storing a number of symbols per encoded codeword; and said encoder block encodes said input data according to said number of symbols per encoded codeword stored in said fifth writable register.

14. The Reed-Solomon encoder/decoder system of claim 13, wherein:

said encode setup block further includes a sixth writable register storing a number of symbols per source codeword; and said encoder block encodes said input data according to said number of symbols per source codeword stored in said sixth writable register.

15. The Reed-Solomon encoder/decoder system of claim 9, wherein:

said decoder setup block further includes a fifth writable register storing a indication of a generator polynomial; and said decoder block decodes said Reed-Solomon coded input data according to said indication of a generator polynomial stored in said fifth writable register.

16. The Reed-Solomon encoder/decoder system of claim 9, wherein:

said encoder setup block further includes a fifth writable register storing a indication of a generator polynomial; and said encoder block encodes said input data according to said indication of a generator polynomial stored in said fifth writable register.

17. The Reed-Solomon encoder/decoder system of claim 9, wherein:

said Reed-Solomon encoder/decoder coprocessor further includes:

a decode memory connected to said decoder block for buffering input and output data, and a encode memory connected to said encoder block for buffering input and output data.

18. The Reed-Solomon encoder/decoder system of claim 17, wherein:

said digital signal processor is capable of transferring data into and out of said decode memory and of transferring data into and out of said encode memory.

19. The Reed-Solomon encoder/decoder system of claim 17, wherein:

said digital signal processor further includes a plurality of data registers defining a register space; and said first, second, third and fourth writable registers of said Reed-Solomon encoder/decoder code processors are within said register space of said digital signal processor.

20. The Reed-Solomon encoder/decoder system of claim 17, wherein:

said first, second, third and fourth writable registers of said Reed-Solomon encoder/decoder code processors are within said data address space of said digital signal processor.

21. The Reed-Solomon encoder/decoder system of claim 9, wherein:

said Reed-Solomon encoder/decoder coprocessor further includes:

a writable command register for storing commands for said Reed-Solomon encoder/decoder coprocessor, and said decoder block and said encoder block are connected to said writable command register and responsive to said commands stored therein.

22. The Reed-Solomon encoder/decoder system of claim 21, wherein:

said digital signal processor further includes a plurality of data registers defining a register space; and said writable command register of said Reed-Solomon encoder/decoder code processors is within said register space of said digital signal processor.

23. The Reed-Solomon encoder/decoder system of claim 21, wherein:

said writable command register of said Reed-Solomon encoder/decoder code processors is within said data address space of said digital signal processor.

* * * * *